United States Patent
Tashiro

(10) Patent No.: US 10,880,506 B2
(45) Date of Patent: Dec. 29, 2020

(54) SOLID-STATE IMAGING DEVICE, ELECTRONIC APPARATUS, AND DRIVING METHOD

(71) Applicant: SONY SEMICONDUCTOR SOLUTIONS CORPORATION, Kanagawa (JP)

(72) Inventor: Yoshiaki Tashiro, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/495,141

(22) PCT Filed: Mar. 15, 2018

(86) PCT No.: PCT/JP2018/010124
§ 371 (c)(1),
(2) Date: Sep. 18, 2019

(87) PCT Pub. No.: WO2018/180522
PCT Pub. Date: Oct. 4, 2018

(65) Prior Publication Data
US 2020/0021759 A1 Jan. 16, 2020

(30) Foreign Application Priority Data

Mar. 29, 2017 (JP) .................... 2017-064273

(51) Int. Cl.
*H04N 5/335* (2011.01)
*H04N 5/355* (2011.01)
(Continued)

(52) U.S. Cl.
CPC ....... *H04N 5/35518* (2013.01); *H04N 5/3741* (2013.01); *H04N 5/37457* (2013.01)

(58) Field of Classification Search
CPC ............. H04N 5/35518; H04N 5/3741; H04N 5/37457
(Continued)

(56) References Cited

U.S. PATENT DOCUMENTS

2006/0081957 A1 4/2006 Itonaga et al.
2007/0267578 A1* 11/2007 Seitz .................... H04N 5/3575
250/395
(Continued)

FOREIGN PATENT DOCUMENTS

CN 1764246 A 4/2006
JP 2006-120679 A 5/2006
(Continued)

OTHER PUBLICATIONS

International Search Report and Written Opinion of PCT Application No. PCT/JP2018/010124, dated May 15, 2018, 06 pages of ISRWO.
(Continued)

*Primary Examiner* — Usman A Khan
(74) *Attorney, Agent, or Firm* — Chip Law Group

(57) ABSTRACT

The present disclosure relates to a solid-state imaging device, an electronic apparatus, and a driving method for reducing power consumption of pixels, and achieving an increase in the number of pixels. Provided is a solid-state imaging device including a pixel array unit that includes pixels arranged in a matrix. From each of the pixels an output signal indicating a logarithmic characteristic is acquired. Each of the pixels includes: a photoelectric conversion unit; a reset transistor that resets the photoelectric conversion unit in accordance with a reset signal; a first amplification transistor that amplifies a signal received from the photoelectric conversion unit; a selection transistor that selects a signal received from the first amplification transis-
(Continued)

tor in accordance with a selection signal; a second amplification transistor that amplifies a signal received from the selection transistor, and applies the amplified signal to a vertical signal line; and a bias transistor that functions as a current source. The first amplification transistor and the second amplification transistor are each connected to a power source voltage. For example, the technology according to the present disclosure is applicable to a logarithmic sensor in a solar cell mode.

12 Claims, 20 Drawing Sheets

(51) Int. Cl.
*H04N 5/374* (2011.01)
*H04N 5/3745* (2011.01)

(58) Field of Classification Search
USPC .......................................................... 348/294
See application file for complete search history.

(56) References Cited

U.S. PATENT DOCUMENTS

2007/0279505 A1* 12/2007 Iwamoto ................ H04N 5/335
   348/294
2008/0217508 A1* 9/2008 Sakuragi .......... H01L 27/14658
   250/200

FOREIGN PATENT DOCUMENTS

| | | |
|---|---|---|
| JP | 2016-058633 A | 4/2016 |
| WO | 2016/038986 A1 | 3/2016 |
| WO | 2017/022451 A1 | 2/2017 |

OTHER PUBLICATIONS

Ni, et al., "A 768×576 Logarithmic Image Sensor with Photodiode in Solar Cell mode", International Image Sensor Workshop(IISW), Jun. 9, 2011, 04 pages.

* cited by examiner

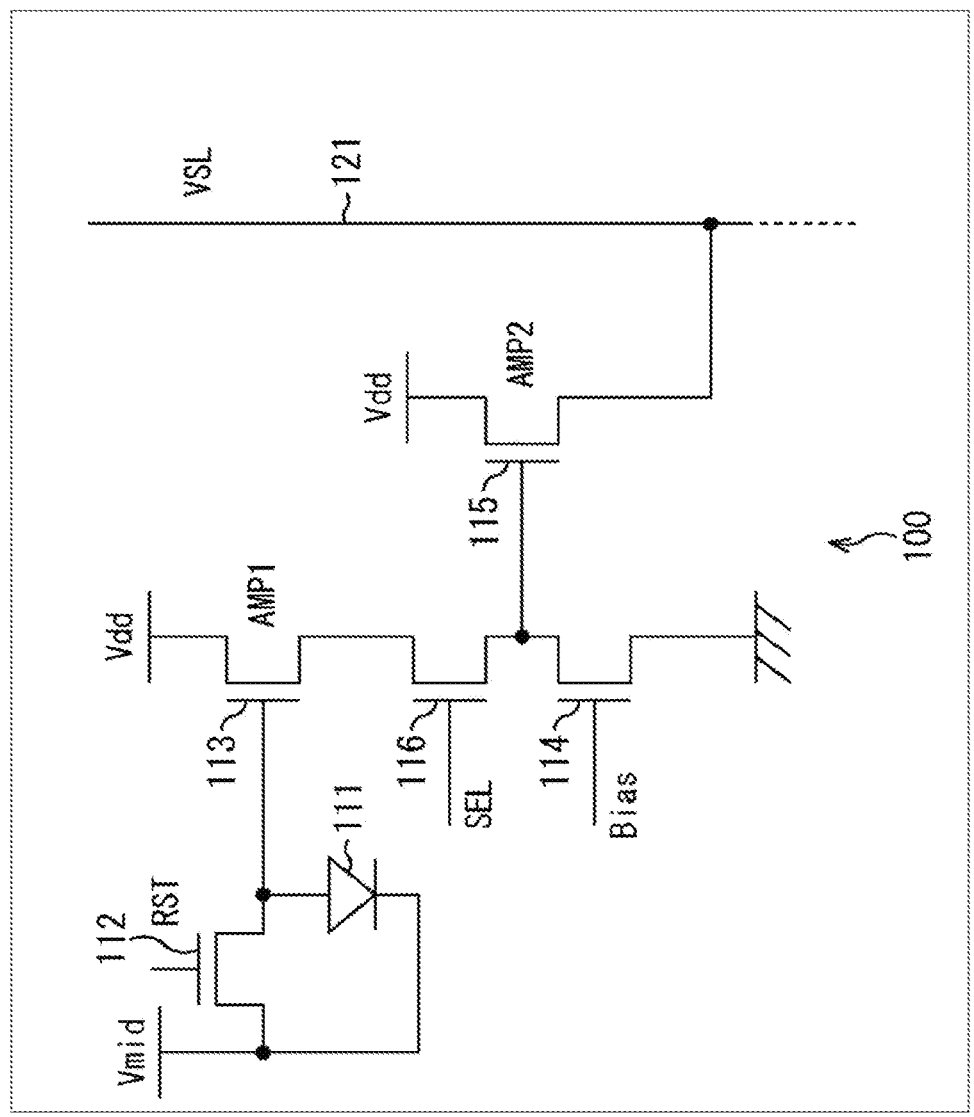
F I G . 4

SOLID-STATE IMAGING DEVICE, ELECTRONIC APPARATUS, AND DRIVING METHOD

CROSS REFERENCE TO RELATED APPLICATIONS

This application is a U.S. National Phase of International Patent Application No. PCT/JP2018/010124 filed on Mar. 15, 2018, which claims priority benefit of Japanese Patent Application No. JP 2017-064273 filed in the Japan Patent Office on Mar. 29, 2017. Each of the above-referenced applications is hereby incorporated herein by reference in its entirety.

TECHNICAL FIELD

The present disclosure relates to a solid-state imaging device, an electronic apparatus, and a driving method, and more particularly to a solid-state imaging device, an electronic apparatus, and a driving method capable of reducing power consumption of pixels, and achieving an increase in the number of pixels.

BACKGROUND ART

A logarithmic sensor (Logarithmic Image Sensor) which operates a photodiode using an open circuit and measures an output voltage of the photodiode similarly to a solar cell is known (e.g., see NPL 1).

The logarithmic sensor in the solar cell mode of this type utilizes such a relation that a potential difference produced when a current flows in a forward direction of PN junction, i.e., a voltage, is proportional to a logarithm of the current. The current in the forward direction is replaced with a photocurrent generated by photoelectric conversion, and a voltage in the forward direction of PN junction is monitored. In this case, the monitored voltage becomes a signal of logarithmically compressed photocurrent.

CITATION LIST

Non Patent Literature

[NPL 1]
2011, International Image Sensor Workshop (IISW), 2011 Jun. 9, Lecture R35, "A 768×576 Logarithmic Image Sensor with Photodiode in Solar Cell mode" Yang Ni, YiMing Zhu, Bogdan Arion New Imaging Technologies SA

SUMMARY

Technical Problem

Meanwhile, a logarithmic sensor in a solar cell mode generally adopts a two-stage amplifier structure including two stage amplifiers for a structure of each pixel so as not to superimpose potential variations of a vertical signal line (VSL) on a transient response of a photodiode.

In the case of adoption of this two-stage amplifier structure, a current source needs to be provided within a pixel. However, the current source provided within the pixel in this manner generates a steady flow of a through current. This flow of the through current raises power consumption, and also produces an obstacle to an increase in the number of pixels.

The present disclosure has been developed in consideration of the aforementioned circumstances, and provides a logarithmic sensor in a solar cell mode, which sensor is capable of reducing power consumption of pixels, and achieving an increase in the number of pixels.

Solution to Problem

A solid-state imaging device according to one aspect of the present disclosure is a solid-state imaging device including a pixel array unit that includes pixels arranged in a matrix, from each of the pixels an output signal indicating a logarithmic characteristic being acquired. Each of the pixels includes a photoelectric conversion unit, a reset transistor that resets the photoelectric conversion unit in accordance with a reset signal, a first amplification transistor that amplifies a signal received from the photoelectric conversion unit, a selection transistor that selects a signal received from the first amplification transistor in accordance with a selection signal, a second amplification transistor that amplifies a signal received from the selection transistor and applies the amplified signal to a vertical signal line, and a bias transistor that is connected to the selection transistor and the second amplification transistor and functions as a current source. The first amplification transistor and the second amplification transistor are each connected to a power source voltage.

An electronic apparatus according to one aspect of the present disclosure is an electronic apparatus including a solid-state imaging device that includes a pixel array unit including pixels arranged in a matrix, from each of the pixels an output signal indicating a logarithmic characteristic being acquired. Each of the pixels includes a photoelectric conversion unit, a reset transistor that resets the photoelectric conversion unit in accordance with a reset signal, a first amplification transistor that amplifies a signal received from the photoelectric conversion unit, a selection transistor that selects a signal received from the first amplification transistor in accordance with a selection signal, a second amplification transistor that amplifies a signal received from the selection transistor and applies the amplified signal to a vertical signal line, and a bias transistor that is connected to the selection transistor and the second amplification transistor and functions as a current source. The first amplification transistor and the second amplification transistor are each connected to a power source voltage.

The solid-state imaging device and the electronic apparatus of the one aspect of the present disclosure includes the pixel array unit including the pixels arranged in a matrix, from each of the pixels an output signal indicating a logarithmic characteristic being acquired. Each of the pixels includes the photoelectric conversion unit, the reset transistor that resets the photoelectric conversion unit in accordance with the reset signal, the first amplification transistor that amplifies the signal received from the photoelectric conversion unit, the selection transistor that selects the signal received from the first amplification transistor in accordance with the selection signal, the second amplification transistor that amplifies the signal received from the selection transistor and applies the amplified signal to the vertical signal line, and the bias transistor that is connected to the selection transistor and the second amplification transistor and functions as the current source. The first amplification transistor and the second amplification transistor are each connected to the power source voltage.

Note that each of the solid-state imaging device or the electronic apparatus of the one aspect of the present disclosure may be either an independent device, or an internal block constituting one device.

A driving method according to one aspect of the present disclosure is a driving method of a solid-state imaging device that includes a pixel array unit, the pixel array unit including pixels arranged in a matrix, from each of the pixels an output signal indicating a logarithmic characteristic being acquired. Each of the pixels includes a photoelectric conversion unit, a reset transistor that resets the photoelectric conversion unit in accordance with a reset signal, a first amplification transistor that amplifies a signal received from the photoelectric conversion unit, a selection transistor that selects a signal received from the first amplification transistor in accordance with a selection signal, a second amplification transistor that amplifies a signal received from the selection transistor and applies the amplified signal to a vertical signal line, and a bias transistor that is connected to the selection transistor and the second amplification transistor and functions as a current source. The first amplification transistor and the second amplification transistor are each connected to a power source voltage. The driving method includes driving such that the reset transistor comes into an on-state during a shutter driving period before an exposure period, driving such that the selection transistor comes into an on-state during a readout period after the exposure period, and driving such that the reset transistor comes into the on-state at a readout time of a reset level during the readout period.

The driving method according to the one aspect of the present disclosure includes driving such that the reset transistor comes into the on-state during the shutter driving period before the exposure period, driving such that the selection transistor comes into the on-state during the readout period after the exposure period, and driving such that the reset transistor comes into the on-state at the readout time of the reset level during the readout period.

A driving method according to one aspect of the present disclosure is a driving method of a solid-state imaging device that includes a pixel array unit, the pixel array unit including pixels arranged in a matrix, from each of the pixels an output signal indicating a logarithmic characteristic being acquired. Each of the pixels includes a photoelectric conversion unit, a reset transistor that resets the photoelectric conversion unit in accordance with a reset signal, a first amplification transistor that amplifies a signal received from the photoelectric conversion unit, a selection transistor that selects a signal received from the first amplification transistor in accordance with a selection signal, a second amplification transistor that amplifies a signal received from the selection transistor and applies the amplified signal to a vertical signal line, and a bias transistor that is connected to the selection transistor and the second amplification transistor and functions as a current source. The first amplification transistor and the second amplification transistor are each connected to a power source voltage. The driving method includes driving such that the reset transistor comes into an on-state during a shutter driving period before an exposure period, driving such that the selection transistor comes into an on-state during a readout period after the exposure period, driving such that the reset transistor comes into the on-state at a readout time of a reset level during the readout period, and driving such that the bias transistor comes into an off-state during periods except for the readout period.

The driving method according to the one aspect of the present disclosure includes driving such that the reset transistor comes into the on-state during the shutter driving period before the exposure period, driving such that the selection transistor comes into the on-state during the readout period after the exposure period, driving such that the reset transistor comes into the on-state at the readout time of the reset level during the readout period, and driving such that the bias transistor comes into the off-state during periods except for the readout period.

Advantageous Effect of Invention

According to an aspect of the present disclosure, reduction of power consumption of pixels, and an increase in the number of pixels are achievable.

Note that advantageous effects to be produced are not limited to the advantageous effect described herein, but may be any advantageous effects described in the present disclosure.

BRIEF DESCRIPTION OF DRAWINGS

FIG. 4 is a circuit diagram depicting a configuration example of a pixel according to a first embodiment.

DESCRIPTION OF EMBODIMENTS

Figure 1:
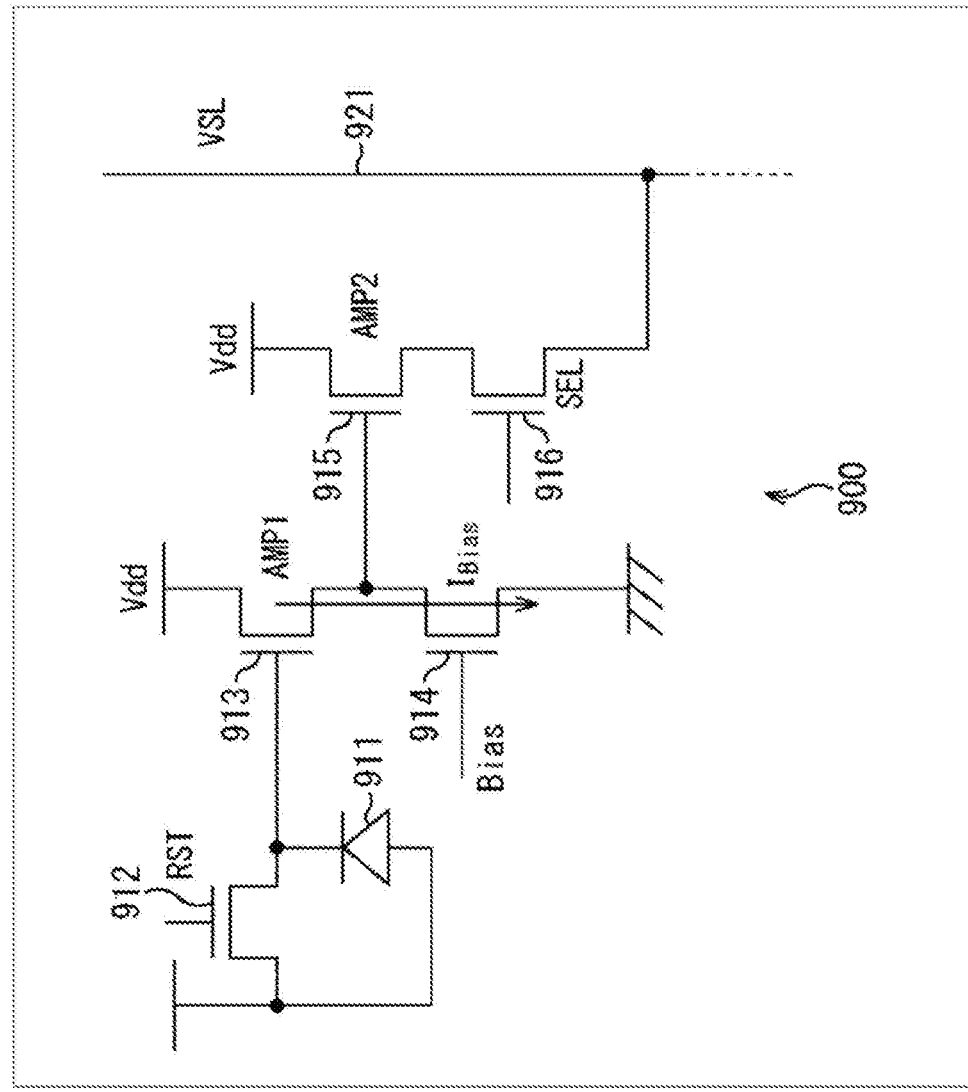
FIG. 1 is a diagram depicting a configuration of a pixel of an ordinary logarithmic sensor in a solar cell mode.

Embodiments of a technology according to the present disclosure (present technology) will be hereinafter described with reference to the drawings. Note that the description is presented in a following order.
1. Outline of technology of present disclosure
2. Configuration example of solid-state imaging device to which technology of present disclosure has been applied
3. First embodiment: Basic configuration
4. Second embodiment: Configuration driving gate input voltage of Bias
5. Third embodiment: Configuration including PD and two-stage amplifier having inversed polarities of transistors
6. Fourth embodiment: Configuration including Bias and AMP2 shared by plural pixels
7. Fifth embodiment: Configuration including shared pixels and including PD and two-stage amplifier having inversed polarities of transistors
8. Configuration example of electronic apparatus including solid-state imaging device to which technology of present disclosure has been applied
9. Cross-sectional configuration example of solid-state imaging device to which technology of present disclosure is applicable
10. Configuration example of stacked solid-state imaging device to which technology of present disclosure is applicable
11. Example of application to mobile body
12. Example of application to in-vivo information acquisition system

1. Outline of Technology of Present Disclosure (Configuration of Pixel of Logarithmic Sensor)

FIG. 1 is a diagram depicting a configuration of a pixel of an ordinary logarithmic sensor in a solar cell mode.

Note that a pixel 900 of the ordinary logarithmic sensor depicted in FIG. 1 corresponds to one of a plurality of pixels arranged in a matrix in a pixel array unit of a solid-state imaging device such as a CMOS (Complementary Metal Oxide Semiconductor) image sensor.

The pixel 900 of the ordinary logarithmic sensor in FIG. 1 includes a photodiode 911, a reset transistor 912, an amplification transistor 913, a bias transistor 914, an amplification transistor 915, and a selection transistor 916.

The photodiode 911 is a photoelectric conversion unit including n-type and p-type semiconductor regions. The reset transistor 912 controls reset of the photodiode 911 in accordance with on-off of a reset signal (RST) applied to a gate electrode of the reset transistor 912.

The amplification transistor 913 amplifies a signal sent from the photodiode 911 and applied to a gate electrode of the amplification transistor 913, and outputs the amplified signal to the amplification transistor 915. The bias transistor 914 functions as a current source.

The amplification transistor 915 amplifies a signal sent from the photodiode 911 and applied to a gate electrode of the amplification transistor 915, and outputs the amplified signal to the selection transistor 916. The selection transistor 916 outputs a signal received from the amplification transistor 915 to a vertical signal line 921 in accordance with on-off of a selection signal (SEL) applied to a gate electrode of the selection transistor 916.

In this manner, the pixel 900 of the ordinary logarithmic sensor adopts a two-stage amplification structure which includes the amplification transistor 913 corresponding to an initial-stage amplifier (AMP1), and the amplification transistor 915 corresponding to a second-stage amplifier (AMP2) so as not to superimpose potential variations of a vertical signal line (VSL) 921 on a transient response of the photodiode 911.

In addition, in the case of adoption of this two-stage amplification structure, the bias transistor 914 functioning as a current source needs to be provided within the pixel 900. The bias transistor 914 thus provided produces such a state that a bias current $I_{Bias}$ steadily flows within the pixel 900.

(Driving Method of Pixel of Logarithmic Sensor)

Figure 2:
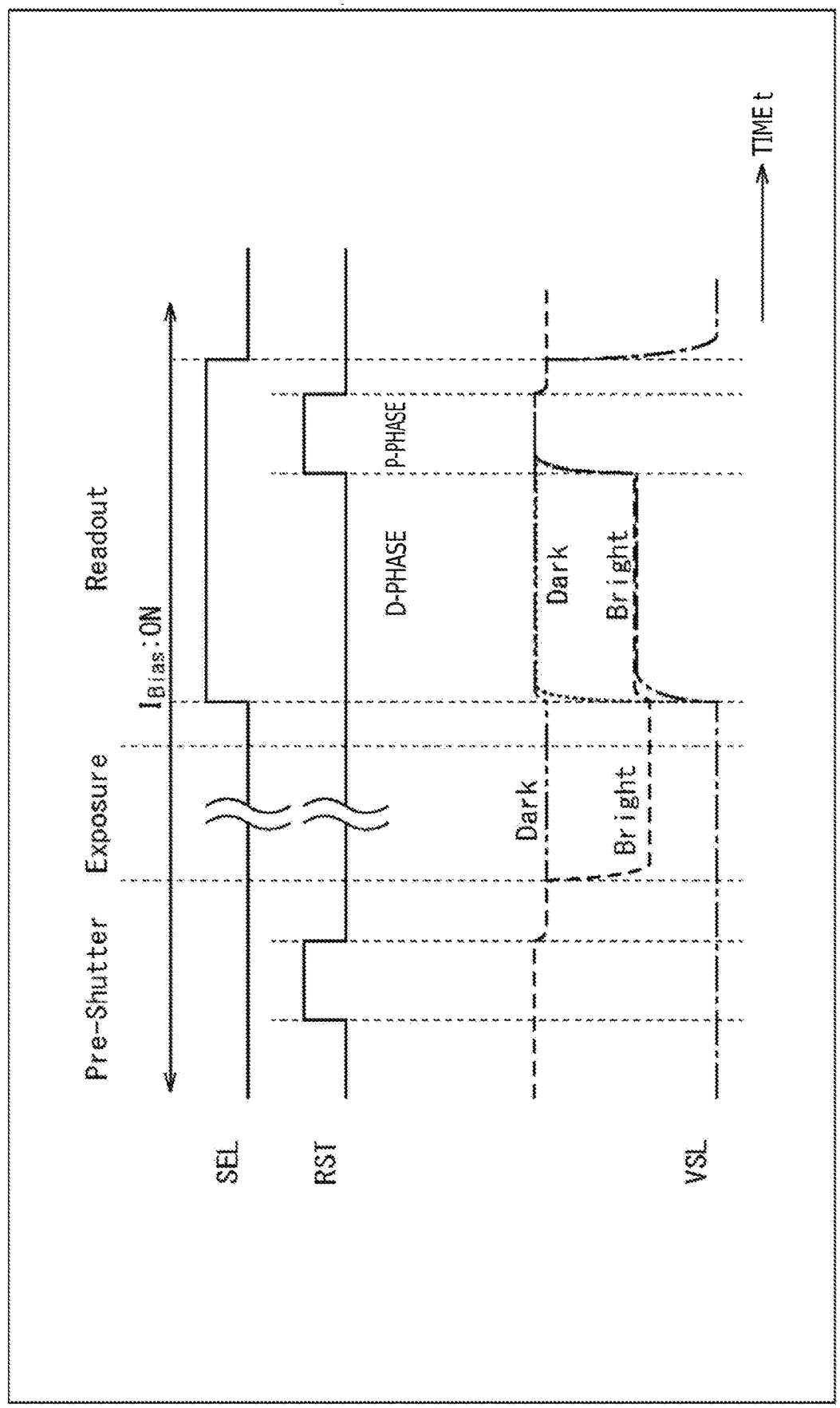
FIG. 2 is a timing chart explaining a driving method of the pixel of the ordinary logarithmic sensor in the solar cell mode.

FIG. 2 is a timing chart explaining a driving method of the pixel 900 of the ordinary logarithmic sensor in the solar cell mode (FIG. 1).

The timing chart in FIG. 2 depicts levels of a selection signal (SEL) applied to the gate electrode of the selection transistor 916, and a reset signal (RST) applied to the gate electrode of the reset transistor 912 in time series in the pixel 900 of the ordinary logarithmic sensor (FIG. 1). In addition, the timing chart in FIG. 2 depicts a level of a signal (VSL) applied to the vertical signal line 921 in time series.

Note that Pre Shutter represents a shutter driving period, Exposure represents an exposure period, and Readout represents a readout period in FIG. 2. In addition, it is assumed that a time proceeds in a direction from the left side to the right side in the figure. Periods shift in an order of the shutter driving period, the exposure period, and the readout period.

As depicted in FIG. 2, the reset signal (RST) reaches an H level in the shutter driving period. In this case, the photodiode 911 is reset to a low potential by the reset transistor 912.

In the subsequent exposure period, charges are accumulated in the photodiode 911. In the exposure period, a source potential of each of the amplification transistor 913 as the initial-stage amplifier (AMP1) and the amplification transistor 915 as the second-stage amplifier (AMP2) varies. At this time, the bias current $I_{Bias}$ constantly flows in the bias transistor 914 as indicated by an arrow in an upper part of the figure.

In the subsequent readout period, the selection signal (SEL) reaches an H level, and the selection transistor 916 comes into an on-state. In this case, a signal generated from the amplification transistor 915 is output to the vertical signal line (VSL) 921.

The selection transistor 916 herein initially reads out charges accumulated in the photodiode 911 as a signal level (S: Signal). Thereafter, the reset signal (RST) reaches the H level, and the photodiode 911 is reset. In this state, the selection transistor 916 reads out a noise level (N: Noise). A difference (S–N) between the signal level (S) and the noise level (N) obtained in this manner corresponds to an output signal (Output).

Subsequently, the selection signal (SEL) reaches an L level, and the selection transistor 916 comes into an off-state. Thereafter, an output from the amplification transistor 915 is cut off. As a result, the potential of the vertical signal line (VSL) 921 decreases to a potential near a ground potential (GND) Even after this state, the bias current $I_{Bias}$ continues to constantly flow in the bias transistor 914.

Thereafter, a linear signal (a signal proportional to intensity of light) is output until charges are accumulated in the photodiode 911 in the pixel 900 of the logarithmic sensor (FIG. 1). When charges are accumulated in the photodiode 911, a current exponentially flows in accordance with a generated voltage. Accordingly, a logarithmic relation between the voltage and the current is established, wherefore output of a logarithmic signal starts.

The foregoing points can be summarized as follows. Specifically, the pixel 900 of the ordinary logarithmic sensor adopts the two-stage amplification structure which includes the amplification transistor 913 as the initial-stage amplifier (AMP1), and the amplification transistor 915 as the second-stage amplifier (AMP2) to prevent superimposition of potential variations of the transient response VSL of the photodiode 911.

In the case of adoption of this two-stage amplifier structure, the bias transistor 914 functioning as a current source needs to be provided within the pixel 900.

On the other hand, in the state that the bias transistor 914 is provided, the amplification transistor 913 as the initial-stage amplifier (AMP1) constantly operates. In this case, the bias current $I_{Bias}$ steadily flows within the pixel 900 (a current constantly flows in the bias transistor 914), wherefore power consumption rises. This rise of power consumption therefore becomes a parameter which limits an increase in the number of pixels, and consequently becomes an obstacle to an increase in the number of pixels.

Accordingly, for solving the aforementioned problems, the technology according to the present disclosure (present technology) proposes a logarithmic sensor in a solar cell mode (a solid-state imaging device) capable of reducing power consumption of pixels, and increasing the number of pixels. A solid-state imaging device including a structure for solving these problems will be hereinafter described.

2. Configuration Example of Solid-State Imaging Device to which Technology of Present Disclosure has been Applied (Configuration Example of Solid-State Imaging Device)

Figure 3:
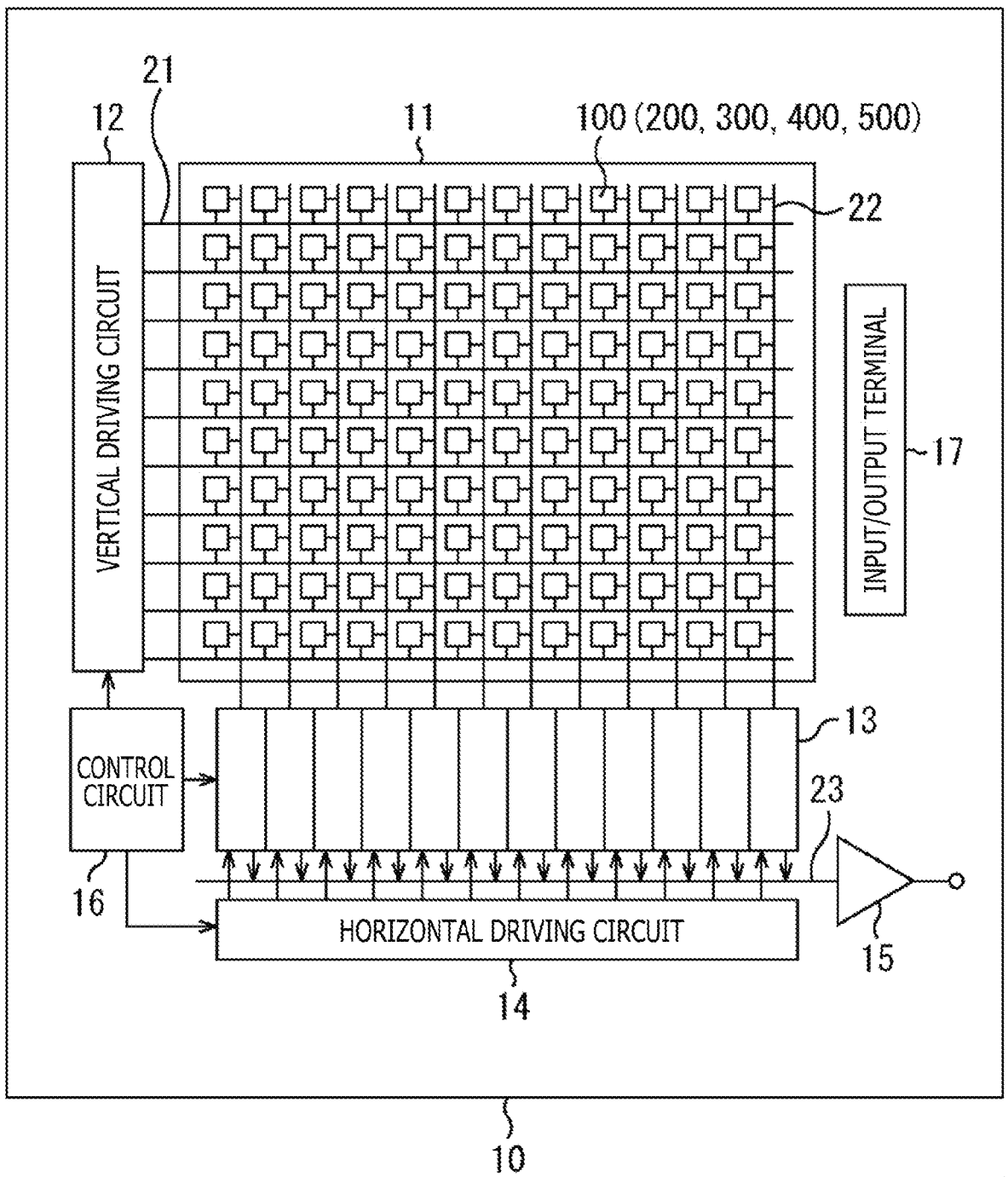
FIG. 3 is a block diagram depicting a configuration example of a solid-state imaging device to which a technology according to the present disclosure has been applied.

FIG. 3 is a diagram depicting a solid-state imaging device according to an embodiment to which the present technology has been applied.

A solid-state imaging device 10 in FIG. 3 is a solid-state imaging device using a CMOS (Complementary Metal Oxide Semiconductor). The solid-state imaging device 10 introduces incident light (image light) received from an object via an optical lens system (not depicted), converts a light amount of the incident light into an electric signal in units of a pixel with an image of the incident light formed on an imaging surface, and outputs the electric signal as a pixel signal.

In FIG. 3, the solid-state imaging device 10 includes a pixel array unit 11, a vertical driving circuit 12, column signal processing circuits 13, a horizontal driving circuit 14, an output circuit 15, a control circuit 16, and an input/output terminal 17.

The pixel array unit 11 includes a plurality of pixels 100 arranged two-dimensionally (in a matrix). Each of the pixels 100 includes a photodiode (PD) as a photoelectric conversion region, and a plurality of pixel transistors.

The vertical driving circuit 12 includes a shift register, for example. The vertical driving circuit 12 selects a predetermined pixel driving line 21, supplies a pulse for driving the pixels 100 to the selected pixel driving line 21, and drives the pixels 100 in units of a row. More specifically, the vertical driving circuit 12 selectively scans the respective pixels 100 of the pixel array unit 11 in units of a row sequentially in the vertical direction, and supplies, to the column signal processing circuits 13 via the vertical signal lines 22, a pixel signal based on a signal charge (charge) generated in accordance with a received light amount at the photodiode of each of the pixels 100.

The column signal processing circuits 13 each arranged for the corresponding column of the pixels 100 perform signal processing such as noise removal in units of a pixel column for signals output from the pixels 100 of each row. For example, the column signal processing circuits 13 perform signal processing, such as CDS (Correlated Double Sampling) and A/D (Analog/Digital) conversion, for removing fixed pattern noise peculiar to pixels.

The horizontal driving circuit 14 includes a shift register, for example, and sequentially outputs a horizontal scanning pulse to sequentially select the column signal processing circuits 13, and causes each of the selected column signal processing circuits 13 to output a pixel signal to a horizontal signal line 23.

The output circuit 15 performs signal processing for signals sequentially supplied from the respective column signal processing circuits 13 via the horizontal signal line 23, and outputs the processed signals. Note that the output circuit 15 only performs buffering in some cases, or performs black level control, column variation correction, various types of digital signal processing or the like in other cases, for example.

The control circuit 16 controls operations of respective parts of the solid-state imaging device 10. For example, the control circuit 16 receives an input clock signal, data for commanding an operation mode and the like, and outputs data such as internal information associated with the solid-state imaging device 10. More specifically, the control circuit 16 generates a clock signal and a control signal as references of operations of the vertical driving circuit 12, the column signal processing circuits 13, the horizontal driving circuit 14 and the like on the basis of a vertical synchronous signal, a horizontal synchronous signal, and a master clock signal. The control circuit 16 outputs the clock signal or the control signal thus generated to the vertical driving circuit 12, the column signal processing circuit 13, the horizontal driving circuit 14 and the like.

The input/output terminal 17 exchanges signals with the outside.

The solid-state imaging device 10 in FIG. 3 configured as described above constitutes a logarithmic sensor in a solar cell mode, which sensor acquires output signals indicating logarithmic characteristics from the pixels 100 arranged two-dimensionally (in a matrix) on the pixel array unit 11.

In addition, pixel configurations of a first embodiment to a fifth embodiment described below may be adopted as the configuration of the pixels 100 arranged two-dimensionally on the pixel array unit 11 of the solid-state imaging device 10. Configuration examples of pixels arranged on the pixel array unit 11 according to the first embodiment to the fifth embodiment will be hereinafter described.

Note that each of the pixels of the first embodiment in the following description is expressed as a pixel 100 to make distinction from pixels of the other embodiments for convenience of explanation. Similarly, pixels of the second embodiment to the fifth embodiment are expressed as pixel 200, pixel 300, pixel 400, and pixel 500, respectively. These pixels are similarly arranged two-dimensionally on the pixel array unit 11 of the solid-state imaging device 10 (FIG. 1).

3. First Embodiment (First Circuit Configuration)

FIG. 4 is a circuit diagram depicting a configuration example of a pixel according to the first embodiment.

The pixel 100 in FIG. 4 includes a photodiode 111, a reset transistor 112, an amplification transistor 113, a bias transistor 114, an amplification transistor 115, and a selection transistor 116.

The photodiode 111 is a photoelectric conversion unit including n-type and p-type semiconductor regions. A cathode electrode of the photodiode 111 is connected to an intermediate potential Vmid and a drain of the reset transistor 112, while an anode electrode of the photodiode 111 is connected to a source of the reset transistor 112 and a gate of the amplification transistor 113.

The drain of the reset transistor 112 is connected to the intermediate potential Vmid and the cathode electrode of the photodiode 111, while the source of the reset transistor 112 is connected to the anode electrode of the photodiode 111 and the gate of the amplification transistor 113. In addition, a reset signal (RST) is applied to a gate electrode of the reset transistor 112. When the reset signal (RST) comes into an active state, a reset gate of the reset transistor 112 comes into a conductive state. As a result, the potential of the photodiode 111 is reset.

A drain of the amplification transistor 113 is connected to a power source voltage Vdd, while a source of the amplification transistor 113 is connected to a drain of the selection transistor 116. The gate of the amplification transistor 113 is connected to the photodiode 111 and the source of the reset transistor 112. A signal sent from the photodiode 111 is applied to the gate of the amplification transistor 113. Accordingly, the amplification transistor 113 amplifies the applied signal and outputs the amplified signal to the selection transistor 116.

The drain of the selection transistor 116 is connected to the source of the amplification transistor 113, while a source of the selection transistor 116 is connected to a drain of the bias transistor 114 and a gate of the amplification transistor 115. In addition, a selection signal (SEL) is applied to a gate electrode of the selection transistor 116. When the selection signal (SEL) comes into an active state, the selection transistor 116 comes into a conductive state. As a result, the pixel 100 comes into a selected state. Accordingly, a signal output from the amplification transistor 113 is output to the amplification transistor 115 via the selection transistor 116.

The drain of the bias transistor 114 is connected to the source of the selection transistor 116 and the gate of the amplification transistor 115, while a source of the bias transistor 114 is grounded. A predetermined signal is applied to a gate electrode of the bias transistor 114 to set a reference current. The bias transistor 114 functions as a current source.

A drain of the amplification transistor 115 is connected to the power source voltage Vdd, while a source of the amplification transistor 115 is connected to a vertical signal line (VSL) 121 (the vertical signal line 22 in FIG. 3). In addition, the gate of the amplification transistor 115 is connected to the source of the selection transistor 116 and the drain of the bias transistor 114.

When the selection signal (SEL) comes into a conductive state in the selection transistor 116 herein, a signal output from the amplification transistor 113 is applied to the gate of the amplification transistor 115 via the selection transistor 116. The amplification transistor 115 amplifies the signal applied to the gate of the amplification transistor 115, and outputs the amplified signal to the vertical signal line 121.

Concerning the amplification transistor 113 and the amplification transistor 115 in the pixel 100, the amplification transistor 113 provided on the photodiode 111 side corresponds to the initial-stage amplifier (AMP1), while the amplification transistor 115 provided on the vertical signal line (VSL) 121 side corresponds to the second-stage amplifier (AMP2). The initial-stage amplifier (AMP1) and the second-stage amplifier (AMP2) constitute a two-stage amplifier. This configuration is different from the pixel 900 of the ordinary logarithmic sensor (FIG. 1) in that the selection transistor 116 is shifted from the second-stage amplifier (AMP2) side to the initial-stage amplifier (AMP1) side.

In addition, the photodiode 111, the amplification transistor 113, the bias transistor 114, the amplification transistor 115, and the selection transistor 116 in the pixel 100 have inversed polarities with respect to the polarities of the photodiode 911, the amplification transistor 913, the bias transistor 914, the amplification transistor 915, and the selection transistor 916 in the pixel 900 of the ordinary logarithmic sensor (FIG. 1), respectively.

More specifically, carriers generated in the photodiode 111 are positive charges corresponding to holes. Accordingly, the polarities are inversed as depicted in FIG. 4 to handle the positive charges as electrons in the transistors of the following stage (the amplification transistor 113, the bias transistor 114, the amplification transistor 115, and the selection transistor 116). This inversion of the polarities allows automatic switching between on and off of the amplification transistor 115.

(First Driving Method)

Figure 5:
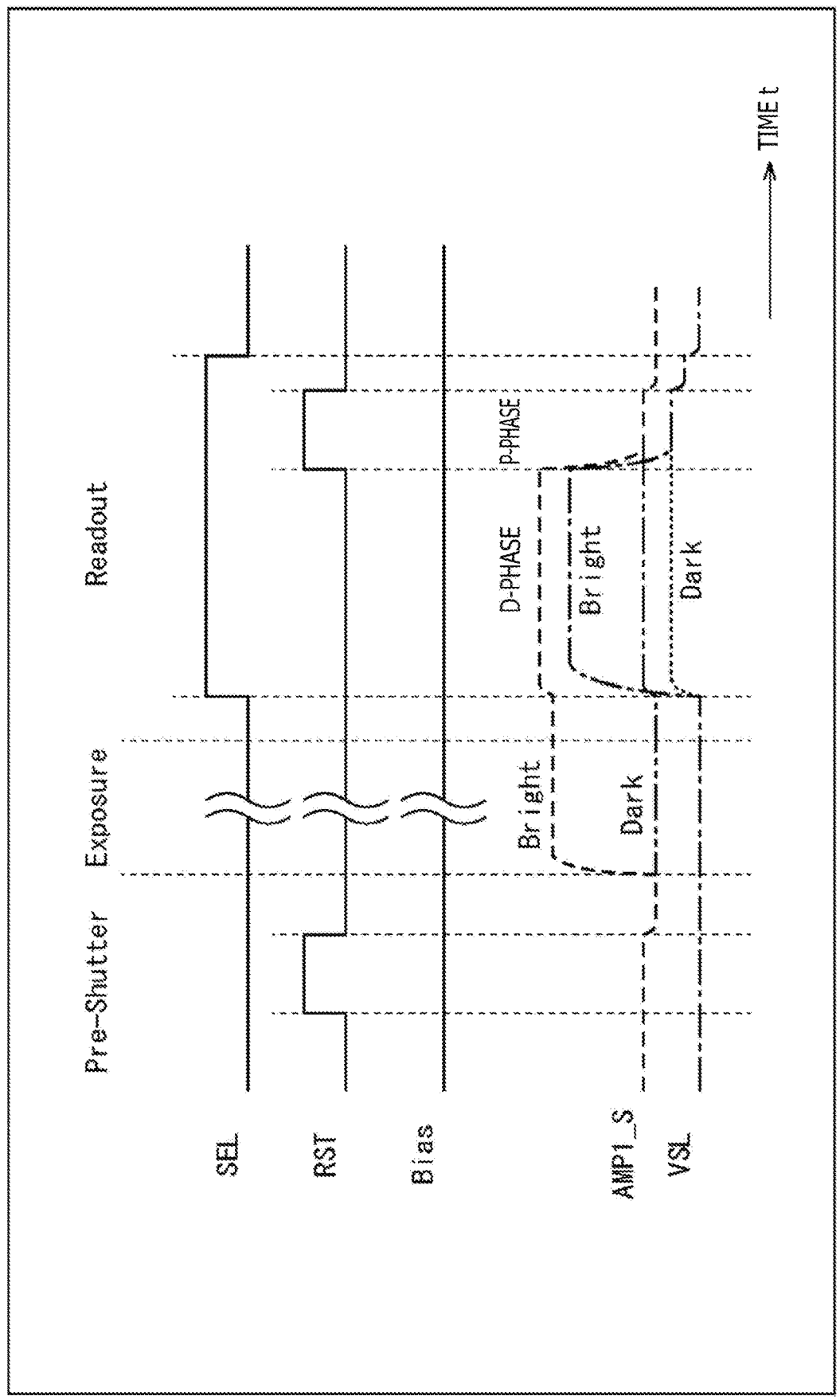
FIG. 5 is a timing chart explaining a driving method of a pixel according to the first embodiment.

FIG. 5 is a timing chart explaining a driving method of a pixel according to the first embodiment.

The timing chart in FIG. 5 depicts levels of a selection signal (SEL) applied to the gate electrode of the selection transistor 116, a reset signal (RST) applied to the gate electrode of the reset transistor 112, and a bias signal (Bias) applied to the gate electrode of the bias transistor 114 in the pixel 100 of the logarithmic sensor (FIG. 4) in time series.

In addition, the timing chart in FIG. 5 depicts levels of a signal (AMP1_S) applied to the source of the amplification transistor 113, and a signal (VSL) applied to the vertical signal line 121 in time series.

Note that Pre Shutter represents a shutter driving period, Exposure represents an exposure period, and Readout represents a readout period in FIG. 5 similarly to FIG. 2. In addition, it is assumed that a time proceeds in a direction from the left side to the right side in the figure. Periods are shifted in an order of the shutter driving period, the exposure period, and the readout period.

In the shutter driving period, the reset signal (RST) reaches an H level, and the photodiode 111 is reset to a low potential by the reset transistor 112 as depicted in FIG. 5. When light enters at an end of the shutter driving period, the period shifts to the exposure period.

In the exposure period, charges are accumulated in the photodiode 111. In the exposure period, a signal from the photodiode 111 is applied to the gate of the amplification transistor 113 as the initial-stage amplifier (AMP1), and the applied signal is amplified. Accordingly, the potential of the source (AMP1_S) of the amplification transistor 113 varies as indicated by a dotted line in the figure.

The selection signal (SEL) herein reaches an L level, and the selection transistor 116 comes into an off-state during the shutter driving period and the exposure period. Accordingly, the bias transistor 114 comes into a state disconnected from the power source voltage Vdd connected to the drain of the amplification transistor 113. As a result, the through current (the bias current) generated in the pixel 900 of the ordinary logarithmic sensor (FIG. 1) is cut off. Power consumption of the pixel 100 (FIG. 4) therefore is more reduced than in the pixel 900 (FIG. 1). When the entrance of the light ends after completion of the exposure period, the period shifts to the readout period.

In the readout period, the selection signal (SEL) reaches an H level. The charges accumulated in the photodiode 111 are read out by the selection transistor 116. The charges accumulated in the photodiode 111 are herein initially read out as a signal level (S: Signal) by the selection transistor 116 at a readout time of the D phase (the signal level).

Subsequently, the reset signal (RST) reaches the H level, and the photodiode 111 is reset at a readout time of the P phase (the reset level). In this state, a noise level (N: Noise) is further read out by the selection transistor 116. A difference (S–N) between the signal level (S) and the noise level (N) thus obtained corresponds to an output signal (Output), and is output to the vertical signal line 121 via the amplification transistor 115 as the second-stage amplifier (AMP2).

At this time, the amplification transistor 115 as the second-stage amplifier (AMP2) is naturally activated by an output of the amplification transistor 113 as the initial-stage amplifier (AMP1) at the time of readout of the D phase in a case where the selection transistor 116 comes into the on-state (the selection signal (SEL) reaches the H level).

Meanwhile, when the selection transistor 116 comes into an off-state (the selection signal (SEL) reaches an L level), the potential of the drain of the bias transistor 114 lowers to a potential near the ground potential (GND). Accordingly, the amplification transistor 115 as the second-stage amplifier (AMP2) is naturally deactivated by a current from the bias transistor 114. As a result, the two-stage amplifier including the initial-stage amplifier (AMP1) and the second-stage amplifier (AMP2) in the pixel 100 (FIG. 4) automatically comes into an off-state.

Thereafter, a linear signal (a signal proportional to intensity of light) is output until charges are accumulated in the photodiode 111 in the pixel 100 of the logarithmic sensor (FIG. 4). When charges are accumulated in the photodiode 111, a current exponentially flows in accordance with a generated voltage. Accordingly, a logarithmic relation between the voltage and the current is established, wherefore output of a logarithmic signal starts.

According to the pixel 100 of the first embodiment as described above, the selection transistor 116 is provided not on the second-stage amplifier (AMP2) side, but on the initial-stage amplifier (AMP1) side. Accordingly, the bias transistor 114 comes into the state disconnected from the power source voltage Vdd connected to the drain of the amplification transistor 113 when the selection transistor 116 comes into the off-state.

As a result, the through current (the bias current) generated in the pixel 900 of the ordinary logarithmic sensor (FIG. 1) can be cut off, wherefore more reduction of power consumption is achievable in the pixel 100 of the first embodiment than in the pixel 900 (FIG. 1). Accordingly, a rise of power consumption does not constitute a parameter limiting an increase in the number of pixels, wherefore an increase in the number of pixels is achievable.

The description of the first embodiment has been now completed.

4. Second Embodiment (Second Circuit Configuration)

Figure 6:
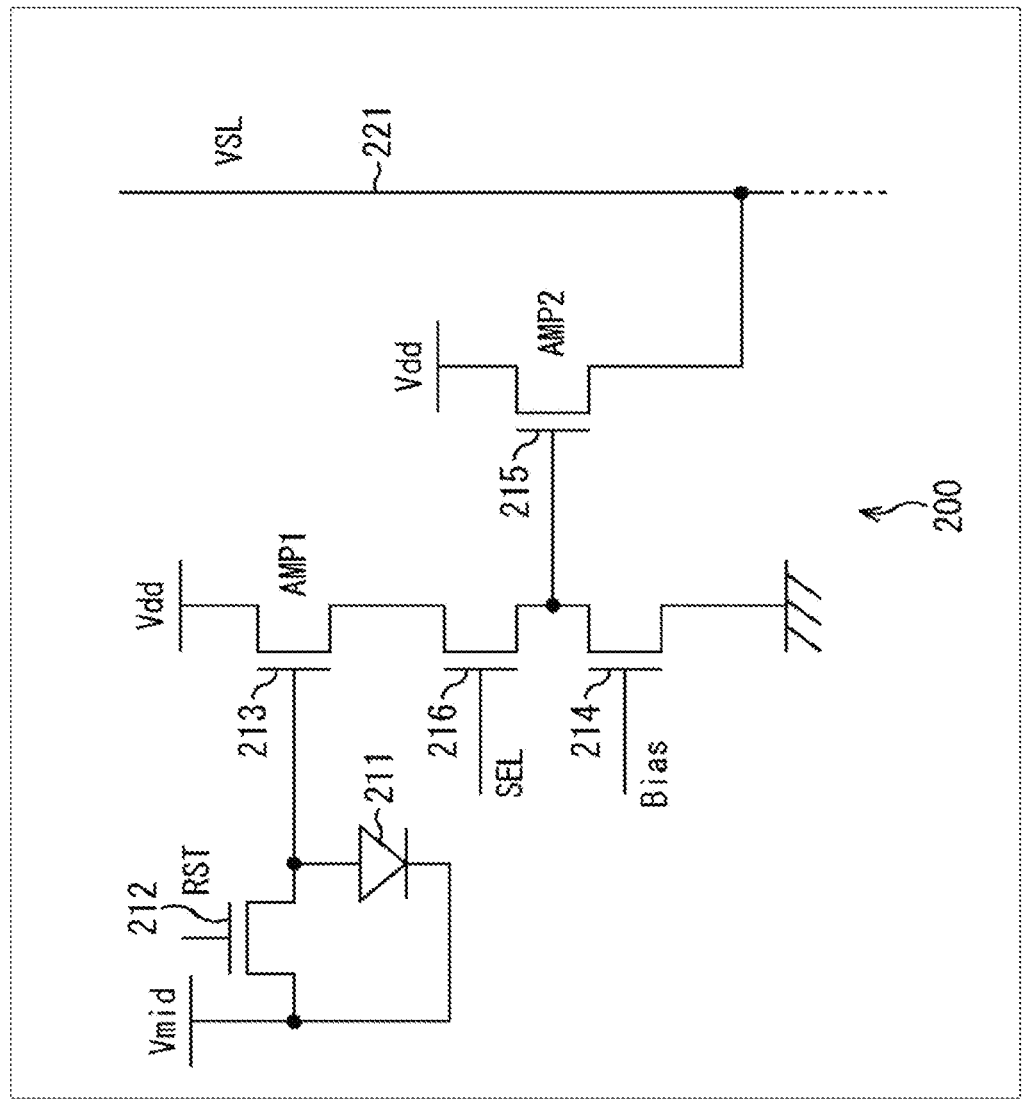
FIG. 6 is a circuit diagram depicting a configuration example of a pixel according to a second embodiment.

FIG. 6 is a circuit diagram depicting a configuration example of a pixel according to the second embodiment.

The pixel 200 in FIG. 6 includes a photodiode 211, a reset transistor 212, an amplification transistor 213, a bias transistor 214, an amplification transistor 215, and a selection transistor 216.

The photodiode 211 to the selection transistor 216 in the pixel 200 in FIG. 6 are configured similarly to the photodiode 111 to the selection transistor 116 in the pixel 100 in FIG. 4. However, driving of the bias transistor 214 is different from driving of the bias transistor 114 in FIG. 4.

More specifically, the pixel 200 in FIG. 6 is different from the pixel 100 in FIG. 4 in that a bias signal (Bias) applied to a gate electrode of the bias transistor 214 is controlled such that the bias transistor 214 is driven to come into an off-state in periods except for the readout period.

(Second Driving Method)

Figure 7:
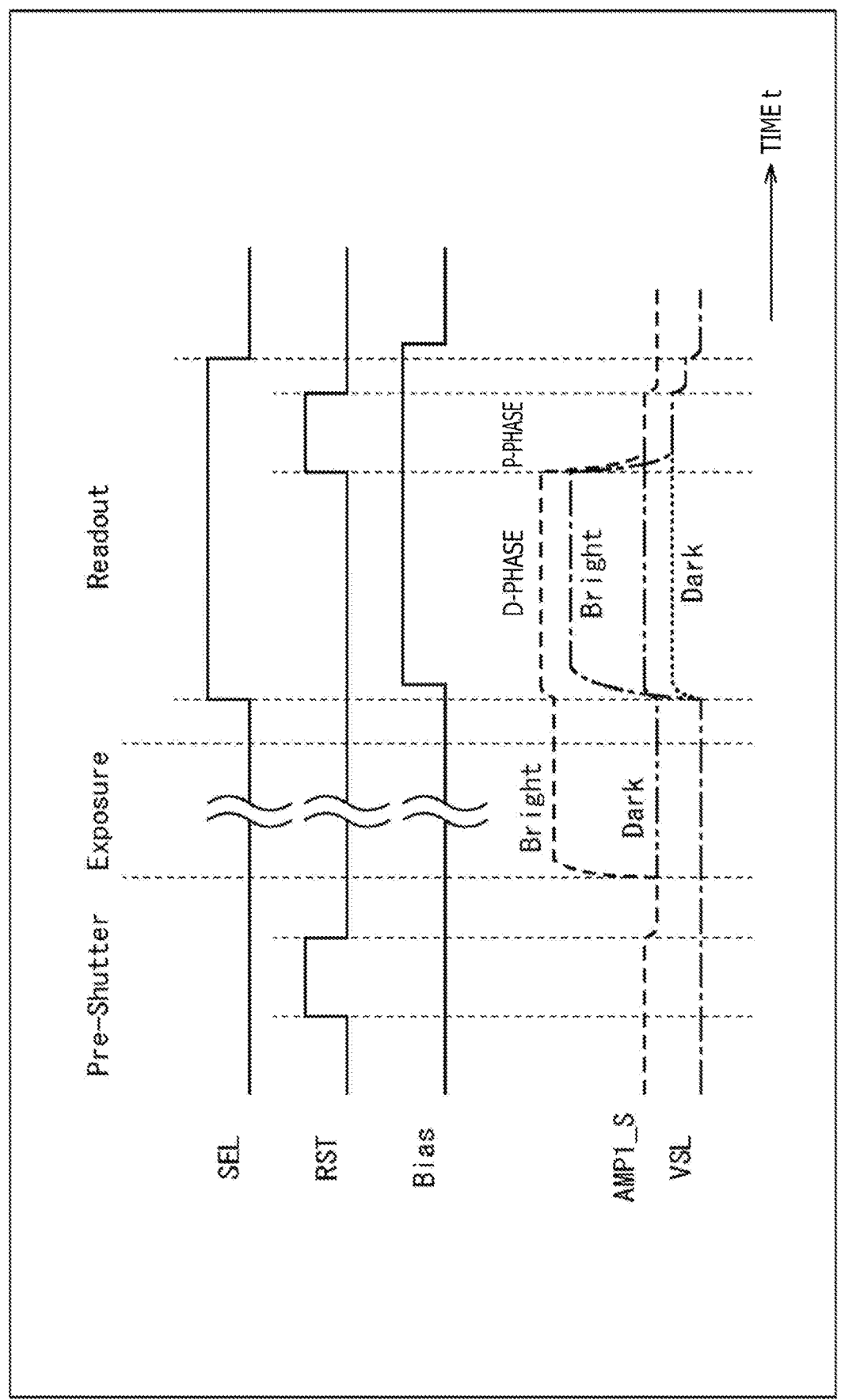
FIG. 7 is a timing chart explaining a driving method of a pixel according to the second embodiment.

FIG. 7 is a timing chart explaining a driving method of a pixel according to the second embodiment.

The timing chart in FIG. 7 depicts levels of a selection signal (SEL) of the selection transistor 216, a reset signal (RST) of the reset transistor 212, and a bias signal (Bias) of the bias transistor 214 in the pixel 200 of the logarithmic sensor (FIG. 6) in time series. In addition, the timing chart in FIG. 7 depicts levels of a signal (AMP1_S) applied to a source of the amplification transistor 213, and a signal (VSL) applied to a vertical signal line 221 in time series.

Note that a time in FIG. 7 proceeds in a direction from the left side to the right side in the figure similarly to FIG. 2 and FIG. 5. Periods are shifted in an order of the shutter driving period (Pre Shutter), the exposure period (Exposure), and the readout period (Readout).

In the shutter driving period, the reset signal (RST) reaches an H level, and the photodiode 211 is reset to a low potential by the reset transistor 212 as depicted in FIG. 7.

Subsequently, in the exposure period, charges are accumulated in the photodiode 211. In the exposure period, a signal sent from the photodiode 211 is applied to a gate of the amplification transistor 213 as the initial-stage amplifier (AMP1), and the applied signal is amplified. Accordingly, the potential of the source (AMP1_S) of the amplification transistor 213 varies as indicated by a dotted line in the figure.

At this time, the bias signal (Bias) reaches an L level, and the bias transistor 214 comes into an off-state during the shutter driving period and the exposure period. Accordingly, no bias current flows in the bias transistor 214. As a result, the through current (the bias current) generated in the pixel 900 of the ordinary logarithmic sensor (FIG. 1) is cut off. Accordingly, power consumption of the pixel 200 (FIG. 6) is more reduced than in the pixel 900 (FIG. 1).

Subsequently, in the readout period, the selection signal (SEL) and the bias signal (Bias) each reach an H level, and the selection transistor 216 and the bias transistor 214 each come into an on-state. Accordingly, the charges accumulated in the photodiode 211 are readout by the selection transistor 216. The charges accumulated in the photodiode 211 are herein initially read out as a signal level (S) by the selection transistor 216 at the time of readout of the D phase.

Subsequently, the reset signal (RST) reaches the H level, and the photodiode 211 is reset at the readout time of the P phase. In this state, a noise level (N) is further read out by the selection transistor 216. A difference (S−N) between the signal level (S) and the noise level (N) thus obtained corresponds to an output signal (Output), and is output to the vertical signal line 221 via the amplification transistor 215 as the second-stage amplifier (AMP2).

At this time, the amplification transistor 215 as the second-stage amplifier (AMP2) is naturally activated by an output of the amplification transistor 213 as the initial-stage amplifier (AMP1) at the time of readout of the D phase in a case where the selection transistor 216 comes into the on-state (the selection signal (SEL) reaches the H level).

Meanwhile, the reset transistor 212 comes into the on-state (the reset signal (RST) reaches the H level), and the photodiode 211 is reset to a low potential at the readout time of the P phase and in a case where the selection transistor 216 comes into the on-state (the selection signal (SEL) reaches the H level). As a result, the amplification transistor 215 as the second-stage amplifier (AMP2) is deactivated.

Thereafter, in a case where the selection transistor 216 comes into the off-state (the selection signal (SEL) reaches the L level), the bias signal (Bias) reaches the L level. In this case, the bias transistor 214 comes into the off-state. Accordingly, no bias current flows in the bias transistor 214. As a result, the through current is cut off, wherefore power consumption is reduced.

Thereafter, a linear signal (a signal proportional to intensity of light) is output until charges are accumulated in the photodiode 211 in the pixel 200 of the logarithmic sensor (FIG. 6). When charges are accumulated in the photodiode 211, a current exponentially flows in accordance with a generated voltage. Accordingly, a logarithmic relation between the voltage and the current is established, wherefore output of a logarithmic signal starts.

According to the pixel 200 of the second embodiment as described above, the selection transistor 216 is provided not on the second-stage amplifier (AMP2) side but on the initial-stage amplifier (AMP1) side, and also driving of the bias transistor 214 is controlled. Accordingly, when the selection transistor 216 comes into the off-state, the bias transistor 214 also comes into the off-state. In this case, no bias current flows in the bias transistor 214.

As a result, the through current (the bias current) generated in the pixel 900 of the ordinary logarithmic sensor (FIG. 1) can be cut off, wherefore more reduction of power consumption is achievable in the pixel 200 of the second embodiment than in the pixel 900 (FIG. 1). Accordingly, a rise of power consumption does not constitute a parameter limiting an increase in the number of pixels, wherefore an increase in the number of pixels is achievable.

The description of the second embodiment has been now completed.

5. Third Embodiment (Third Circuit Configuration)

Figure 8:
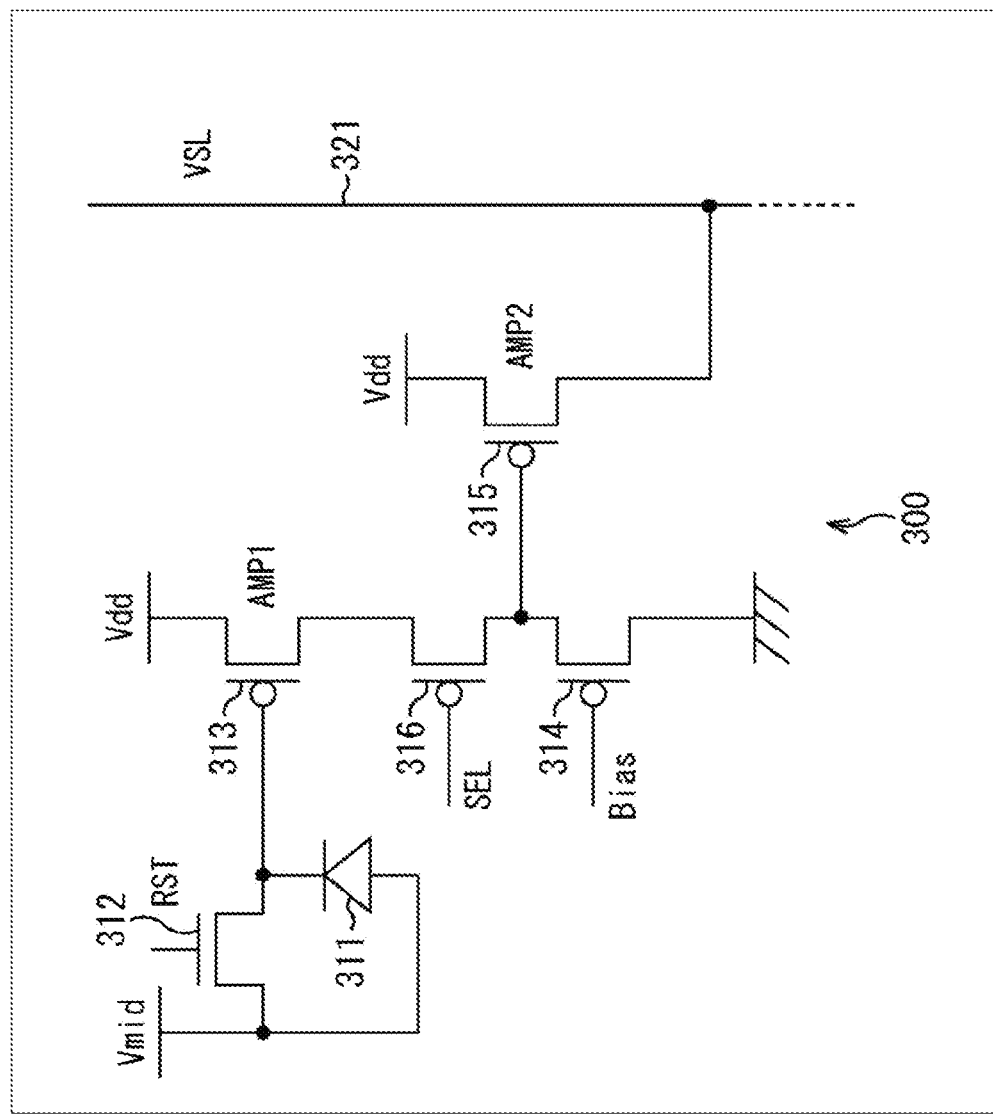
FIG. 8 is a circuit diagram depicting a configuration example of a pixel according to a third embodiment.

FIG. 8 is a circuit diagram depicting a configuration example of a pixel according to the third embodiment.

The pixel 300 in FIG. 8 includes a photodiode and a two-stage amplifier having inversed polarities of transistors with respect to the polarities of the transistors in the pixel 100 depicted in FIG. 4.

More specifically, a photodiode 311, an amplification transistor 313, a bias transistor 314, an amplification transistor 315, and a selection transistor 316 of the pixel 300 in FIG. 8 have inversed polarities with respect to the polarities of the photodiode 111, the amplification transistor 113, the bias transistor 114, the amplification transistor 115, and the selection transistor 116 of the pixel 100 in FIG. 4.

The pixel 300 thus configured includes the photodiode and the two-stage amplifier having inversed polarities of the transistors with respect to the polarities of the transistors in the pixel 100. In this case, the selection transistor 316 is shifted from the second-stage amplifier (AMP2) side toward the initial-stage amplifier (AMP1) side. Accordingly, a current power within the pixel 300 can be disconnected in periods except for the readout period by an operation of the selection transistor 316 in accordance with the selection signal (SEL). As a result, a through current steadily generated within the pixel 300 can be cut off, wherefore power consumption can be reduced.

In addition, the amplification transistor 315 as the second-stage amplifier (AMP2) in the image 300 is naturally activated by an output of the amplification transistor 313 as the initial-stage amplifier (AMP1) at the time of readout of the D phase in a case where the selection transistor 316 comes into an on-state.

Meanwhile, when the selection transistor 316 comes into an off-state in the image 300, the potential of the bias transistor 314 lowers to a potential near the ground potential (GND). Accordingly, the amplification transistor 315 as the second-stage amplifier (AMP2) is naturally deactivated by a current from the bias transistor 314. As a result, the two-stage amplifier including the initial-stage amplifier (AMP1) and the second-stage amplifier (AMP2) in the image 300 automatically comes into an off-state.

Note that the image 300 may be driven such that the bias transistor 314 comes into an off-state in periods except for the readout period by controlling a gate input voltage of the bias transistor 314 similarly to the driving method of the pixel 200 depicted in FIGS. 6 and 7.

The description of the third embodiment has been now completed.

6. Fourth Embodiment (Fourth Circuit Configuration)

Figure 9:
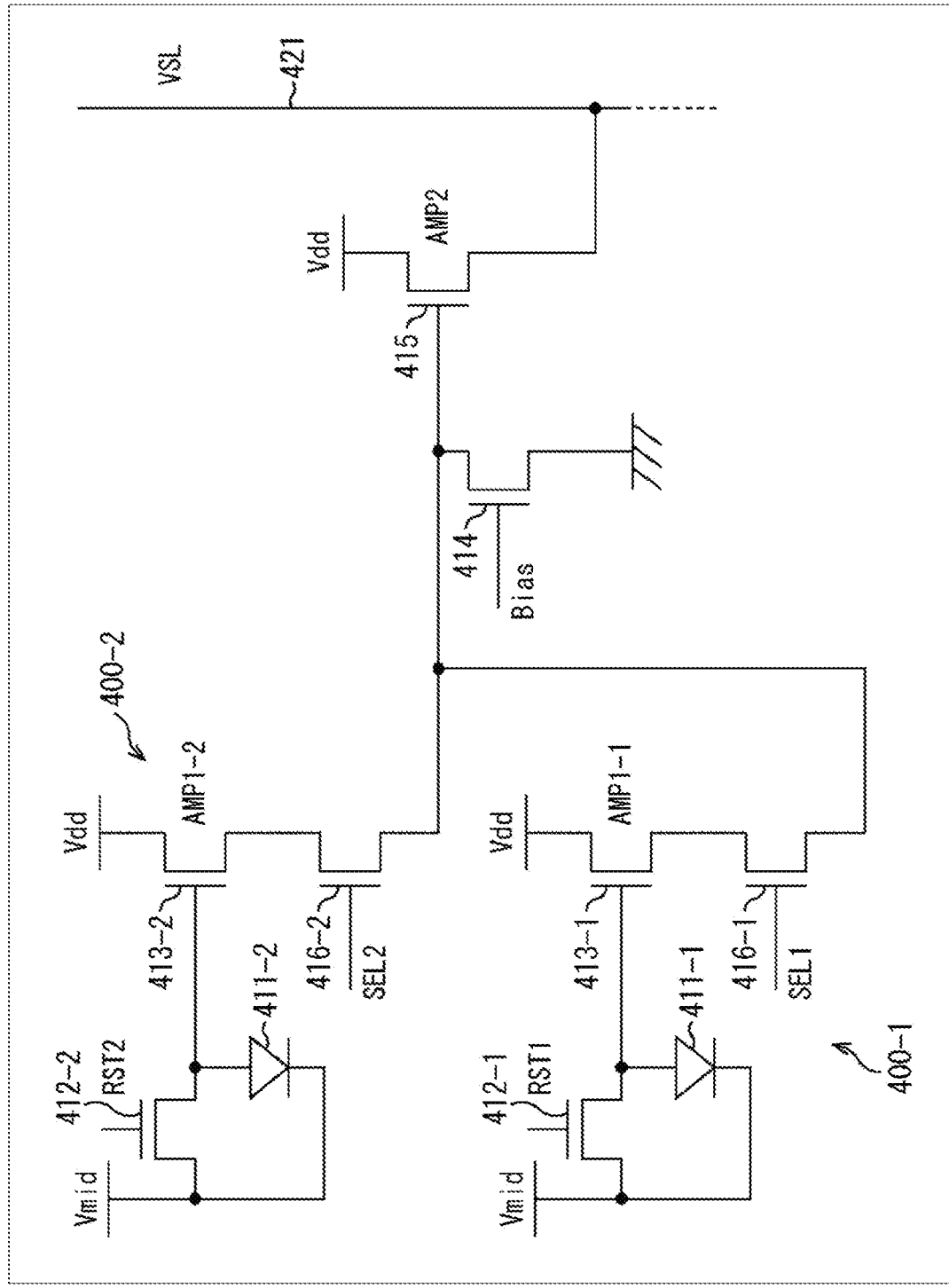
FIG. 9 is a circuit diagram depicting a configuration example of a pixel according to a fourth embodiment.

FIG. 9 is a circuit diagram depicting a configuration example of a pixel according to the fourth embodiment.

A pixel 400-1 and a pixel 400-2 in FIG. 9 are presented as an example of a plurality of pixels arranged two-dimensionally on the pixel array unit 11, and include, as shared components, a bias transistor 414, and an amplification transistor 415 as the second-stage amplifier (AMP2).

More specifically, the pixel 400-1 includes the bias transistor 414 and the amplification transistor 415 as transistors shared with the pixel 400-2, in addition to a photodiode 411-1, a reset transistor 412-1, an amplification transistor 413-1, and a selection transistor 416-1.

In the pixel 400-1 thus configured, the selection transistor 416-1 is shifted toward the initial-stage amplifier (AMP1-1) side similarly to the pixel 100 in FIG. 4. Accordingly, a current source within the pixel 400-1 can be disconnected in periods except for the readout period by an operation of the selection transistor 416-1 in accordance with the selection signal (SEL). As a result, a through current steadily generated within the pixel 400-1 can be cut off, wherefore reduction of power consumption is achievable.

In addition, the amplification transistor 415 as the second-stage amplifier (AMP2) in the pixel 400-1 is naturally activated by an output of the amplification transistor 413-1 as the initial-stage amplifier (AMP1-1) at the time of readout of the D phase in a case where the selection transistor 416-1 comes into an on-state.

Meanwhile, when the selection transistor 416-1 comes into an off-state in the pixel 400-1, the potential of the bias transistor 414 lowers to a potential near the ground potential (GND). Accordingly, the amplification transistor 415 as the second-stage amplifier (AMP2) is naturally deactivated by a current from the bias transistor 414. As a result, the two-stage amplifier including the initial-stage amplifier (AMP1-1) and the second-stage amplifier (AMP2) in the image 400-1 automatically comes into an off-state.

In addition, the pixel 400-2 includes the bias transistor 414 and the amplification transistor 415 as transistors shared with the pixel 400-1, in addition to a photodiode 411-2, a reset transistor 412-2, an amplification transistor 413-2, and a selection transistor 416-2.

In the pixel 400-2 thus configured, the selection transistor 416-2 is shifted toward the initial-stage amplifier (AMP1-2) side similarly to the pixel 100 in FIG. 4. Accordingly, a current source within the pixel 400-2 can be disconnected in periods except for the readout period by an operation of the selection transistor 416-2 in accordance with the selection signal (SEL). As a result, a through current steadily generated within the pixel 400-2 can be cut off, wherefore reduction of power consumption is achievable.

In addition, the amplification transistor 415 as the second-stage amplifier (AMP2) in the pixel 400-2 is naturally activated by an output of the amplification transistor 413-2 as the initial-stage amplifier (AMP1-2) at the time of readout of the D phase in a case where the selection transistor 416-2 comes into an on-state.

Meanwhile, when the selection transistor 416-2 comes into an off-state in the pixel 400-2, the potential of the bias transistor 414 lowers to a potential near the ground potential (GND). Accordingly, the amplification transistor 415 as the second-stage amplifier (AMP2) is naturally deactivated by a current from the bias transistor 414. As a result, the two-stage amplifier including the initial-stage amplifier (AMP1-2) and the second-stage amplifier (AMP2) in the pixel 400-2 automatically comes into an off-state.

Note that the pixel 400-1 and the pixel 400-2 may be each driven such that the bias transistor 314 comes into an off-state in periods except for the readout period by controlling a gate input voltage of the bias transistor 314 similarly to the driving method of the pixel 200 depicted in FIG. 6 and FIG. 7.

In addition, the example of two pixels, i.e., the pixel 400-1 and the pixel 400-2, has been presented as a unit of shared pixels in FIG. 9. However, for example, the bias transistor and the amplification transistor as the second-stage amplifier (AMP2) may be shared between a larger number of pixels, such as four pixels and eight pixels.

The description of the fourth embodiment has been now completed.

7. Fifth Embodiment (Fifth Circuit Configuration)

Figure 10:
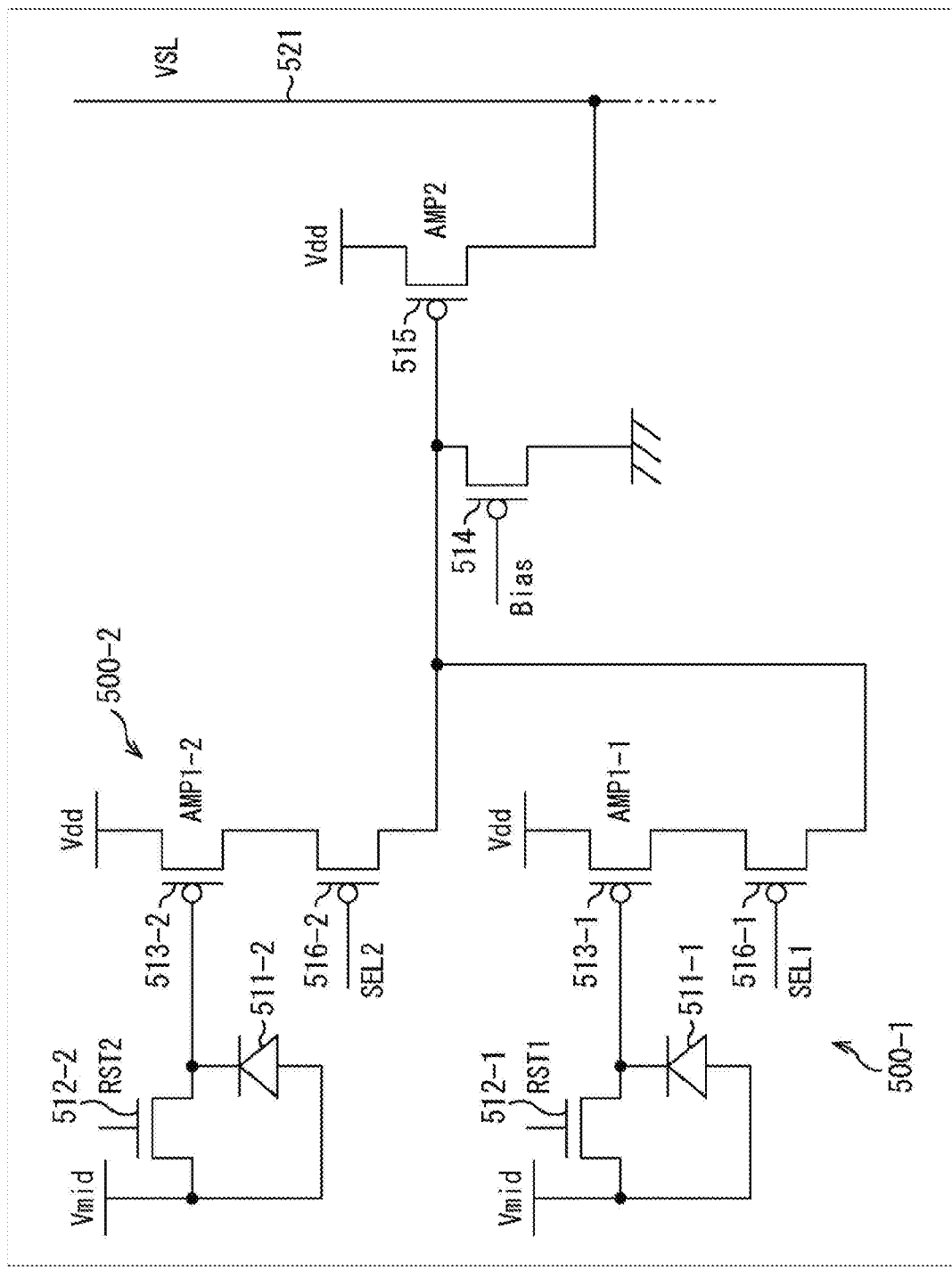
FIG. 10 is a circuit diagram depicting a configuration example of a pixel according to a fifth embodiment.

FIG. 10 is a circuit diagram depicting a configuration example of a pixel according to the fifth embodiment.

A pixel 500-1 and a pixel 500-2 in FIG. 10 each include a photodiode and a two-stage amplifier having inversed polarities of the transistors with respect to the polarities of the pixel 400-1 and the pixel 400-2 depicted in FIG. 9, respectively.

More specifically, a photodiode 511-1, an amplification transistor 513-1, a selection transistor 516-1, and a bias transistor 514 and an amplification transistor 515 as transistors shared with the pixel 500-2 in the pixel 500-1 in FIG. 10 have inversed polarities with respect to the polarities of the photodiode 411-1, the amplification transistor 413-1, the selection transistor 416-1, the bias transistor 414, and the amplification transistor 415 in the pixel 400-1 in FIG. 9.

In the pixel 500-1 thus configured, the selection transistor 516-1 is shifted toward the initial-stage amplifier (AMP1-1) side similarly to the pixel 100 in FIG. 4. Accordingly, a current source within the pixel 500-1 can be disconnected in periods except for the readout period by an operation of the selection transistor 516-1 in accordance with the selection signal (SEL). As a result, a through current steadily generated within the pixel 500-1 can be cut off, wherefore reduction of power consumption is achievable.

In addition, the amplification transistor 515 as the second-stage amplifier (AMP2) in the pixel 500-1 is naturally activated by an output of the amplification transistor 513-1 as the initial-stage amplifier (AMP1-1) at the time of readout of the D phase in a case where the selection transistor 516-1 comes into an on-state.

Meanwhile, when the selection transistor 516-1 comes into an off-state in the pixel 500-1, the potential of the bias transistor 514 lowers to a potential near the ground potential (GND). Accordingly, the amplification transistor 515 as the second-stage amplifier (AMP2) is naturally deactivated by a current from the bias transistor 514. As a result, the two-stage amplifier including the initial-stage amplifier (AMP1-1) and the second-stage amplifier (AMP2) in the image 500-1 automatically comes into an off-state.

In addition, a photodiode 511-2, an amplification transistor 513-2, a selection transistor 516-2, and the bias transistor 514 and the amplification transistor 515 as transistors shared with the pixel 500-1 in the pixel 500-2 in FIG. 10 have inversed polarities with respect to the polarities of the photodiode 411-2, the amplification transistor 413-2, the selection transistor 416-2, the bias transistor 414, and the amplification transistor 415 in the pixel 400-2 in FIG. 9.

In the pixel 500-2 thus configured, the selection transistor 516-2 is shifted toward the initial-stage amplifier (AMP1-2) side similarly to the pixel 100 in FIG. 4. Accordingly, a current source within the pixel 500-2 can be disconnected in periods except for the readout period by an operation of the selection transistor 516-2 in accordance with the selection signal (SEL). As a result, a through current steadily generated within the pixel 500-2 can be cut off, wherefore reduction of power consumption is achievable.

In addition, the amplification transistor 515 as the second-stage amplifier (AMP2) in the pixel 500-2 is naturally activated by an output of the amplification transistor 513-2 as the initial-stage amplifier (AMP1-2) at the time of readout of the D phase in a case where the selection transistor 516-2 comes into an on-state.

Meanwhile, when the selection transistor 516-2 comes into an off-state in the pixel 500-2, the potential of the bias transistor 514 lowers to a potential near the ground potential (GND). Accordingly, the amplification transistor 515 as the second-stage amplifier (AMP2) is naturally deactivated by a current from the bias transistor 514. As a result, the two-stage amplifier including the initial-stage amplifier (AMP1-2) and the second-stage amplifier (AMP2) in the pixel 500-2 automatically comes into an off-state.

The description of the fifth embodiment has been now completed.

Figure 11:
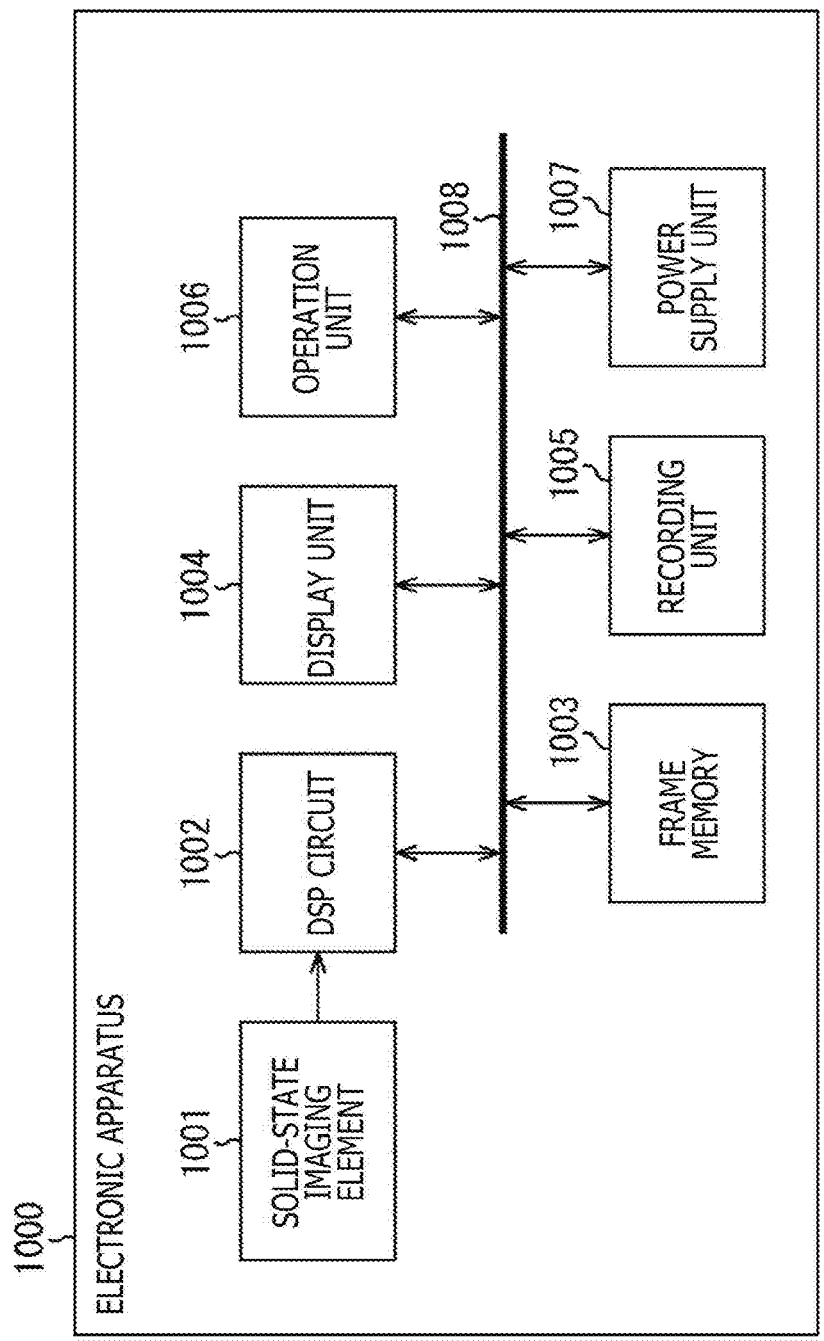
FIG. 11 is a block diagram depicting a configuration example of an electronic apparatus including a solid-state imaging device to which the technology according to the present disclosure has been applied.

8. Configuration Example of Electronic Apparatus Including Solid-State Imaging Device to which Technology of Present Disclosure has been Applied FIG. 11 is a block diagram depicting a configuration example of an electronic apparatus 1000 including a solid-state imaging device to which the technology according to the present disclosure has been applied.

For example, the electronic apparatus 1000 is an electronic apparatus such as an imaging device including a digital still camera and a video camera, and a portable terminal device including a smartphone and a tablet type terminal.

The electronic apparatus 1000 includes a solid-state imaging element 1001, a DSP circuit 1002, a frame memory 1003, a display unit 1004, a recording unit 1005, an operation unit 1006, and a power supply unit 1007. In addition, the DSP circuit 1002, the frame memory 1003, the display unit 1004, the recording unit 1005, the operation unit 1006, and the power supply unit 1007 in the electronic apparatus 1000 are connected to each other via a bus line 1008.

The solid-state imaging element 1001 corresponds to the solid-state imaging device 10 (FIG. 3) described above. For example, the pixel 100 disposed on the pixel array unit 11 has the configuration depicted in FIG. 4 and other figures. More specifically, the pixel 100 (or any one of the pixel 200 to the pixel 500) which includes the selection transistor 116 (or any one of the selection transistor 216 to the selection transistor 516) shifted from the second-stage amplifier (AMP2) side to the initial-stage amplifier (AMP1) side is arranged on the pixel array unit 11 of the solid-state imaging device 10.

The DSP circuit 1002 is a camera signal processing circuit which processes a signal supplied from the solid-state imaging element 1001. The DSP circuit 1002 outputs image data obtained by processing the signal received from the solid-state imaging element 1001. The frame memory 1003 temporarily retains the image data processed by the DSP circuit 1002 in units of a frame.

For example, the display unit 1004 includes a panel type display device such as a liquid crystal panel and an organic EL (Electro Luminescence) panel, and displays a moving image or a still image captured by the solid-state imaging element 1001. The recording unit 1005 records the image data such as a moving image and a still image captured by the solid-state imaging element 1001 in a recording medium such as a semiconductor memory, a hard disk or the like.

The operation unit 1006 outputs operation commands associated with various types of functions of the electronic apparatus 1000 in accordance with an operation by a user. The power supply unit 1007 appropriately supplies various types of power sources to supply targets, i.e., the DSP circuit 1002, the frame memory 1003, the display unit 1004, the recording unit 1005, and the operation unit 1006, as operation power sources of these supply targets.

The electronic apparatus 1000 is configured as described above. The technology according to the present disclosure is applied to the solid-state imaging element 1001 as described above. More specifically, the solid-state imaging device 10 in FIG. 3 is applicable to the solid-state imaging element 1001. For example, reduction of power consumption of pixels, and an increase in the number of pixels are achievable by applying the technology according to the present disclosure to the solid-state imaging element 1001. Accordingly, a higher quality image can be captured.

Figure 12:
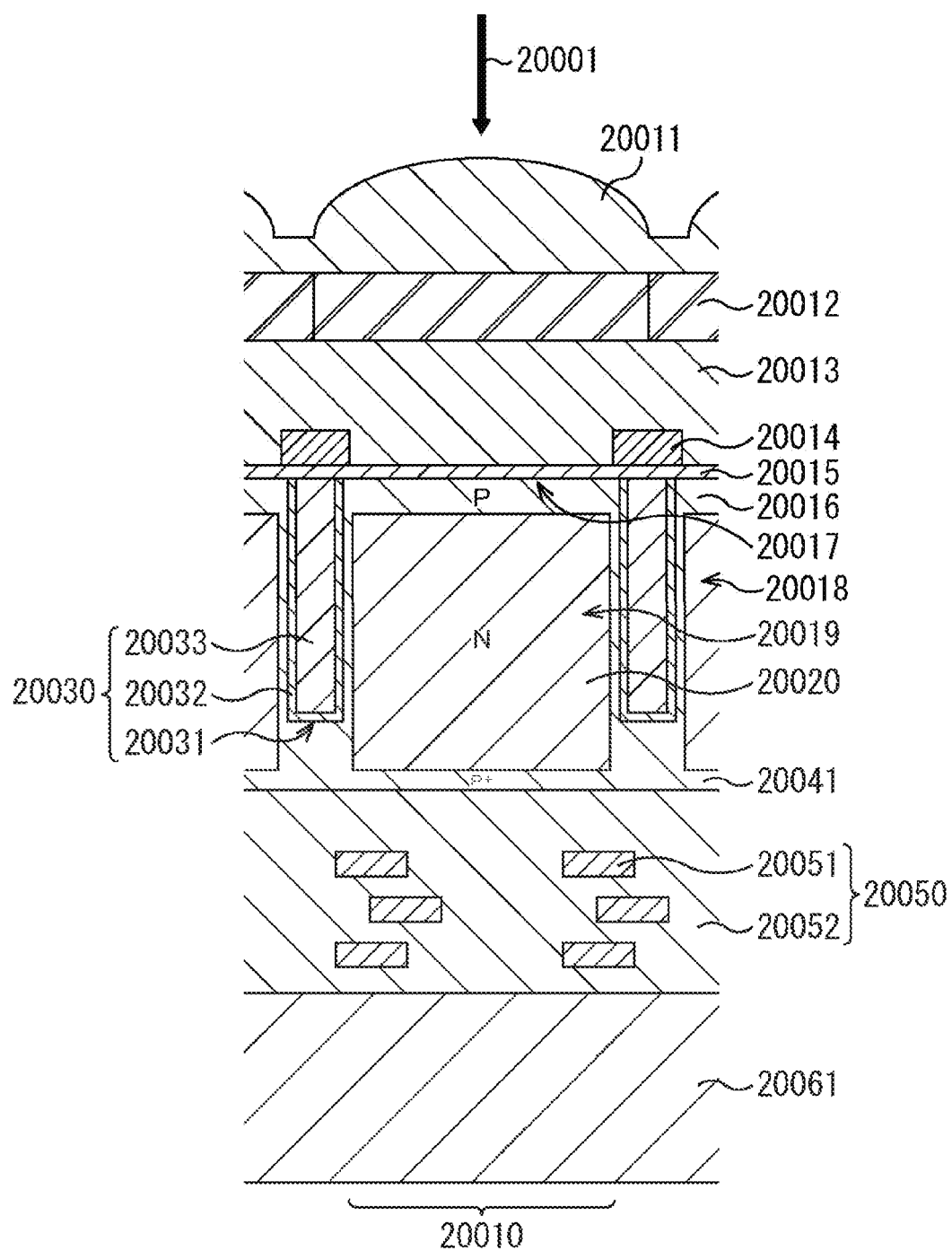
FIG. 12 is a cross-sectional view depicting a configuration example of a solid-state imaging device to which the technology according to the present disclosure is applicable.

9. Cross-Sectional Configuration Example of Solid-State Imaging Device to which Technology of Present Disclosure is Applicable FIG. 12 is a cross-sectional view depicting a configuration example of a solid-state imaging device to which the technology according to the present disclosure is applicable.

According to the solid-state imaging device, a PD (photodiode) 20019 constituting a pixel 20010 receives incident light 20001 entering from the rear surface (the upper surface in the figure) side of a semiconductor substrate 20018. A flattened film 20013, a CF (color filter) 20012, and a microlens 20011 are provided above the PD 20019. The incident light 20001 sequentially entering the PD 20019 via respective parts is received at a light receiving surface 20017, and photoelectrically converted in the PD 20019.

For example, the PD 20019 includes an n-type semiconductor region 20020 formed as a charge accumulation region where charges (electrons) are accumulated. The n-type semiconductor region 20020 in the PD 20019 is provided inside p-type semiconductor regions 20016 and 20041 of the semiconductor substrate 20018. The p-type semiconductor region 20041 is provided on the front surface (the lower surface) side of the semiconductor substrate 20018 in the n-type semiconductor region 20020. The p-type semiconductor region 20041 has a higher impurity concentration than an impurity concentration on the rear surface (the upper surface) side. Accordingly, the PD 20019 has a HAD (Hole-Accumulation Diode) structure. The p-type semiconductor regions 20016 and 20041 are formed in such a manner as to reduce generation of a dark current in each of interfaces on the upper surface side and the lower surface side of the n-type semiconductor region 20020.

Pixel separation portions 20030 are provided inside the semiconductor substrate 20018 to electrically separate the plurality of pixels 20010 from each other. The PD 20019 is provided in each of regions sectioned by the pixel separation portions 20030. In a case where the solid-state imaging device is viewed from the upper surface side in the figure, the pixel separation portions 20030 are formed in a grid shape and are each interposed between the plurality of pixels 20010. The PD 20019 is formed within each of the regions sectioned by the pixel separation portions 20030.

Each anode of the respective PDs 20019 is grounded. Signal charges (e.g., electrons) accumulated in the PD 20019 in the solid-state imaging device are read out via a not-depicted transfer Tr (MOS FET) or the like, and output to a not-depicted VSL (vertical signal line) as an electric signal.

A wiring layer 20050 is provided on the front surface (the lower surface) of the semiconductor substrate 20018 on the side opposite to the rear surface (the upper surface) on which respective parts such as a light shield film 20014, the CF 20012, and the microlens 20011 are provided.

The wiring layer 20050 includes wires 20051 and an insulation layer 20052, and is formed such that the wires 20051 are electrically connected to respective elements within the insulation layer 20052. The wiring layer 20050 is a so-called multilayer wiring layer, and formed by alternately laminating the wires 20051 and interlayer insulation films constituting the insulation layer 20052 a plurality of times. The wires 20051 herein include a wire to a transfer Tr or other Trs for reading charges from the PD 20019, and other wires such as a VSL each laminated via the insulation layer 20052.

A support substrate 20061 is provided on a surface of the wiring layer 20050 on the side opposite to the side where the PD 20019 is provided. For example, a substrate including a silicon semiconductor having a thickness of several hundreds of μm is provided as the support substrate 20061.

The light shield film 20014 is provided on the rear surface (the upper surface in the figure) side of the semiconductor substrate 20018.

The light shield film 20014 is configured to shield a part of the incident light 20001 traveling from an upper part of the semiconductor substrate 20018 toward a lower part of the semiconductor substrate 20018.

The light shield film 20014 is provided above the pixel separation portion 20030 disposed inside the semiconductor substrate 20018. The light shield film 20014 herein is provided on the rear surface (the upper surface) of the semiconductor substrate 20018 in such a condition as to protrude from the semiconductor substrate 20018 in a shape of a projection via the insulation film 20015 such as a silicon oxide film. On the other hand, a portion above the PD 20019 provided inside the semiconductor substrate 20018 is not equipped with the light shield film 20014, but is opened to allow entrance of the incident light 20001 into the PD 20019.

More specifically, in a case where the solid-state imaging device is viewed from the upper surface side in the figure, the light shield film 20014 has a grid planar shape, and has an opening through which the incident light 20001 passes toward the light receiving surface 20017.

The light shield film 20014 includes a light shielding material which shields light. For example, the light shield film 20014 is formed by sequentially laminating a titanium (Ti) film and a tungsten (W) film. Alternatively, the light shield film 20014 may be formed by sequentially laminating a titanium nitride (TiN) film and a tungsten (W) film, for example. In addition, the light shield film 20014 may be covered with nitride (N) or the like.

The light shield film 20014 is covered with the flattened film 20013. The flattened film 20013 includes an insulation material which transmits light.

The pixel separation portion 20030 includes a groove 20031, a fixed charge film 20032, and an insulation film 20033.

The fixed charge film 20032 is so formed as to cover the groove 20031 which separates the plurality of pixels 20010 from each other on the rear surface (the upper surface) side of the semiconductor substrate 20018.

More specifically, the fixed charge film 20032 is provided in such a condition as to cover an inner surface of the groove 20031 formed on the rear surface (the upper surface) side of the semiconductor substrate 20018 with a fixed thickness. In addition, the insulation film 20033 is provided so as to be buried in the inside of the groove 20031 covered with the fixed charge film 20032 (the inside of the groove 20031 is filled with the insulation film 20033).

The fixed charge film 20032 herein is formed by using a high dielectric which has negative fixed charges to form a positive charge (hole) accumulation region in an interface portion with the semiconductor substrate 20018 and thereby reduce generation of a dark current. In the state that the fixed charge film 20032 having negative fixed charges is formed, these negative fixed charges add an electric field to the interface with the semiconductor substrate 20018, and form a positive charge (hole) accumulation region.

For example, the fixed charge film 20032 may be formed by a hafnium oxide film ($HfO_2$ film). Alternatively, the fixed charge film 20032 may include at least one of oxides such as hafnium, zirconium, aluminum, tantalum, titanium, magnesium, yttrium, and lanthanoid, for example.

The technology according to the present disclosure is applicable to the solid-state imaging device described above.

10. Configuration Example of Stacked Solid-State Imaging Device to which Technology of Present Disclosure is Applicable FIGS. 13A, 13B, and 13C are diagrams depicting an outline of a configuration example of a stacked solid-state imaging device to which the technology according to the present disclosure is applicable.

Figure 13A:
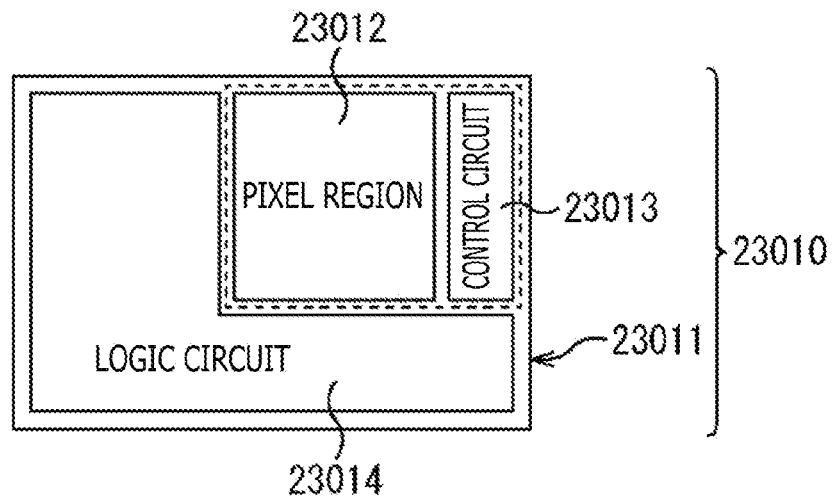
FIGS. 13A, 13B, and 13C are diagrams depicting an outline of a configuration example of a stacked solid-state imaging device to which the technology according to the present disclosure is applicable.

FIG. 13A depicts a schematic configuration example of a non-stacked solid-state imaging device. As depicted in FIG. 13A, a solid-state imaging device 23010 includes one die (semiconductor substrate) 23011. A pixel region 23012 including pixels arranged in an array, a control circuit 23013 performing various controls such as pixel driving, and a logic circuit 23014 for processing signals are mounted on the die 23011.

Figure 13B:
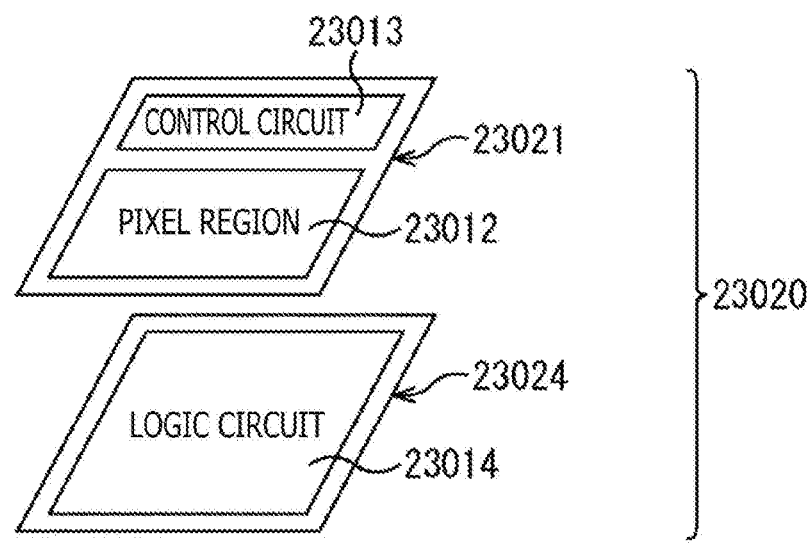
Figure 13C:
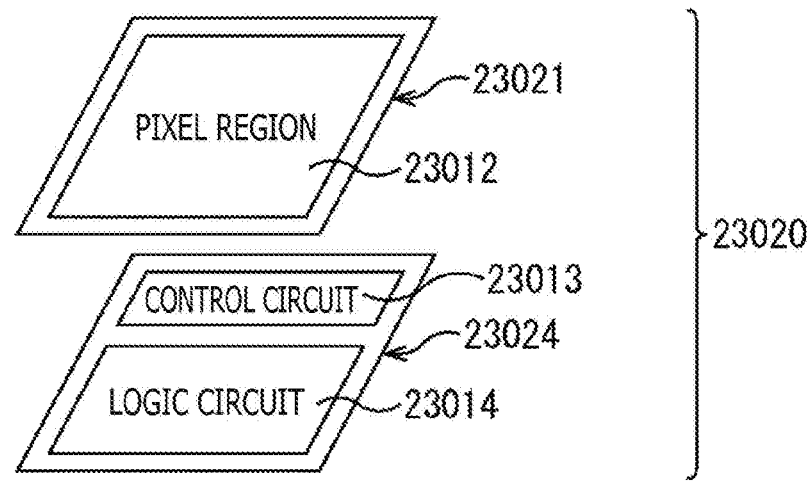

FIGS. 13B and 13C each depict a schematic configuration example of a stacked solid-state imaging device. As depicted in FIGS. 13B and 13C, a solid-state imaging device 23020 includes two dies, i.e., a sensor die 23021 and a logic die 23024 stacked on and electrically connected to each other, and constitutes one semiconductor chip.

FIG. 13B, the pixel region 23012 and the control circuit 23013 are mounted on the sensor die 23021, while the logic circuit 23014 which includes a signal processing circuit performing signal processing is mounted on the logic die 23024.

FIG. 13C, the pixel region 23012 is mounted on the sensor die 23021, while the control circuit 23013 and the logic circuit 23014 are mounted on the logic die 23024.

Figure 14:
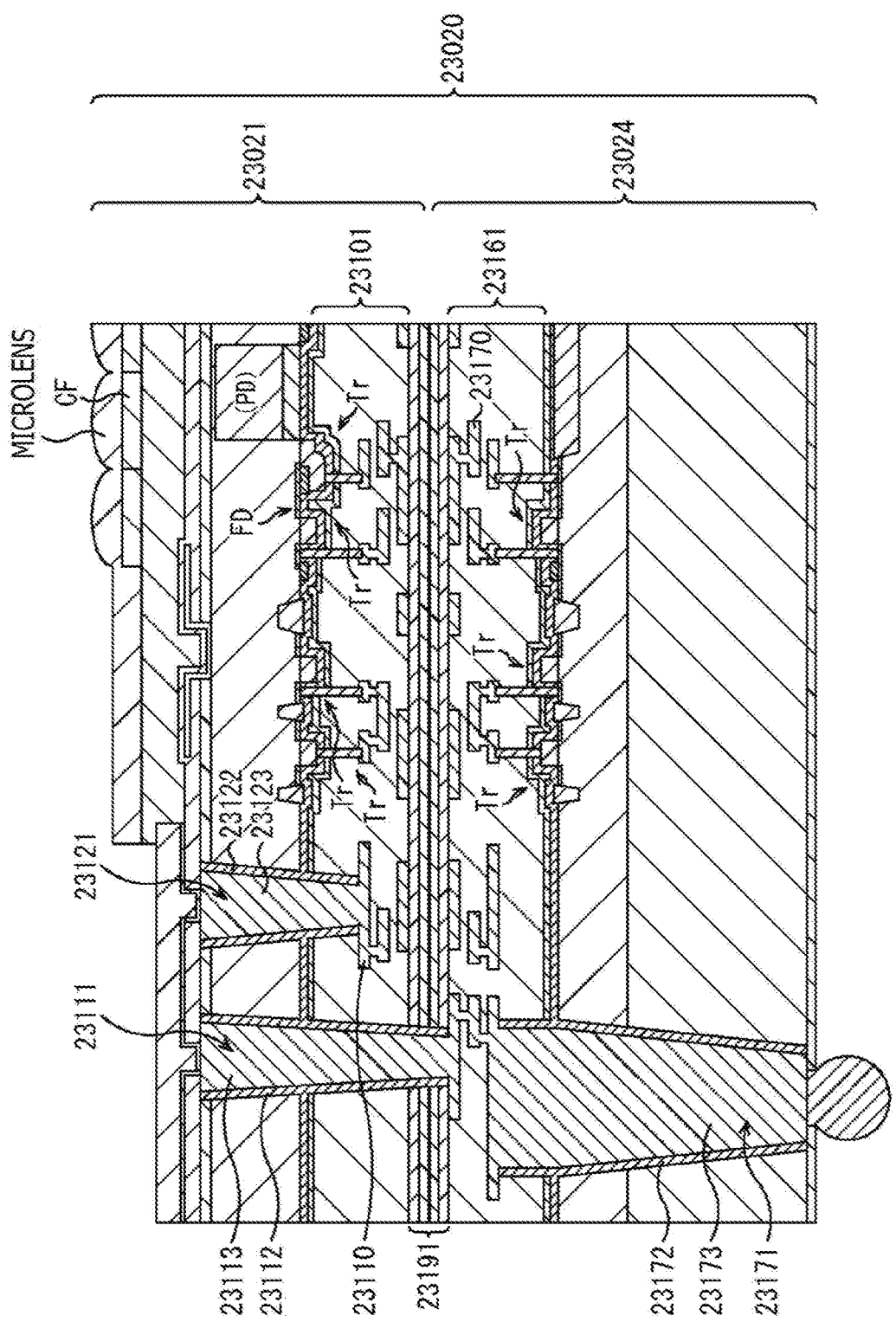
FIG. 14 is a cross-sectional view depicting a first configuration example of the stacked solid-state imaging device.

FIG. 14 is a cross-sectional view depicting a first configuration example of the stacked solid-state imaging device 23020.

The sensor die 23021 includes a PD (photodiode) which constitutes pixels corresponding to the pixel region 23012, an FD (floating diffusion), Trs (MOS FETs), and Trs constituting the control circuit 23013, and others. The sensor die 23021 further includes a wiring layer 23101 which includes wiring 23110 having a plurality of layers, or three layers in the present embodiment. Note that the control circuit 23013 (Trs constituting the control circuit 23013) may be provided not on the sensor die 23021 but on the logic die 23024.

The logic die 23024 includes Trs constituting the logic circuit 23014. The logic die 23024 further includes a wiring layer 23161 which includes wiring 23170 having a plurality of layers, or three layers in the present embodiment. The logic die 23024 further includes a connection hole 23171 on an inner wall surface of which an insulation film 23172 is formed. A connection conductor 23173 connected to the wiring 23170 and the like is embedded in the connection hole 23171.

The sensor die 23021 and the logic die 23024 are affixed to each other in such a manner that the wiring layer 23101 of the sensor die 23021 and the wiring layer 23161 of the logic die 23024 face each other to thereby constitute the stacked solid-state imaging device 23020 including the sensor die 23021 and the logic die 23024 stacked on each other. A film 23191 such as a protection film is provided on affixing surfaces of the sensor die 23021 and the logic die 23024.

The sensor die 23021 includes a connection hole 23111 which extends from the rear surface side (the light entrance side into the PD) (upper side) of the sensor die 23021, penetrates the sensor die 23021, and reaches the wiring 23170 on the uppermost layer of the logic die 23024. The sensor die 23021 further includes a connection hole 23121 which is located in the vicinity of the connection hole 23111, and reaches the wiring 23110 on the first layer from the rear surface side of the sensor die 23021. An insulation film 23112 is formed on an inner wall surface of the connection hole 23111, while an insulation film 23122 is formed on an inner wall surface of the connection hole 23121. In addition, connection conductors 23113 and 23123 are embedded in the connection holes 23111 and 23121, respectively. The connection conductor 23113 and the connection conductor 23123 are electrically connected to each other on the rear surface side of the sensor die 23021. In this manner, the sensor die 23021 and the logic die 23024 are electrically connected to each other via the wiring layer 23101, the connection hole 23121, the connection hole 23111, and the wiring layer 23161.

Figure 15:
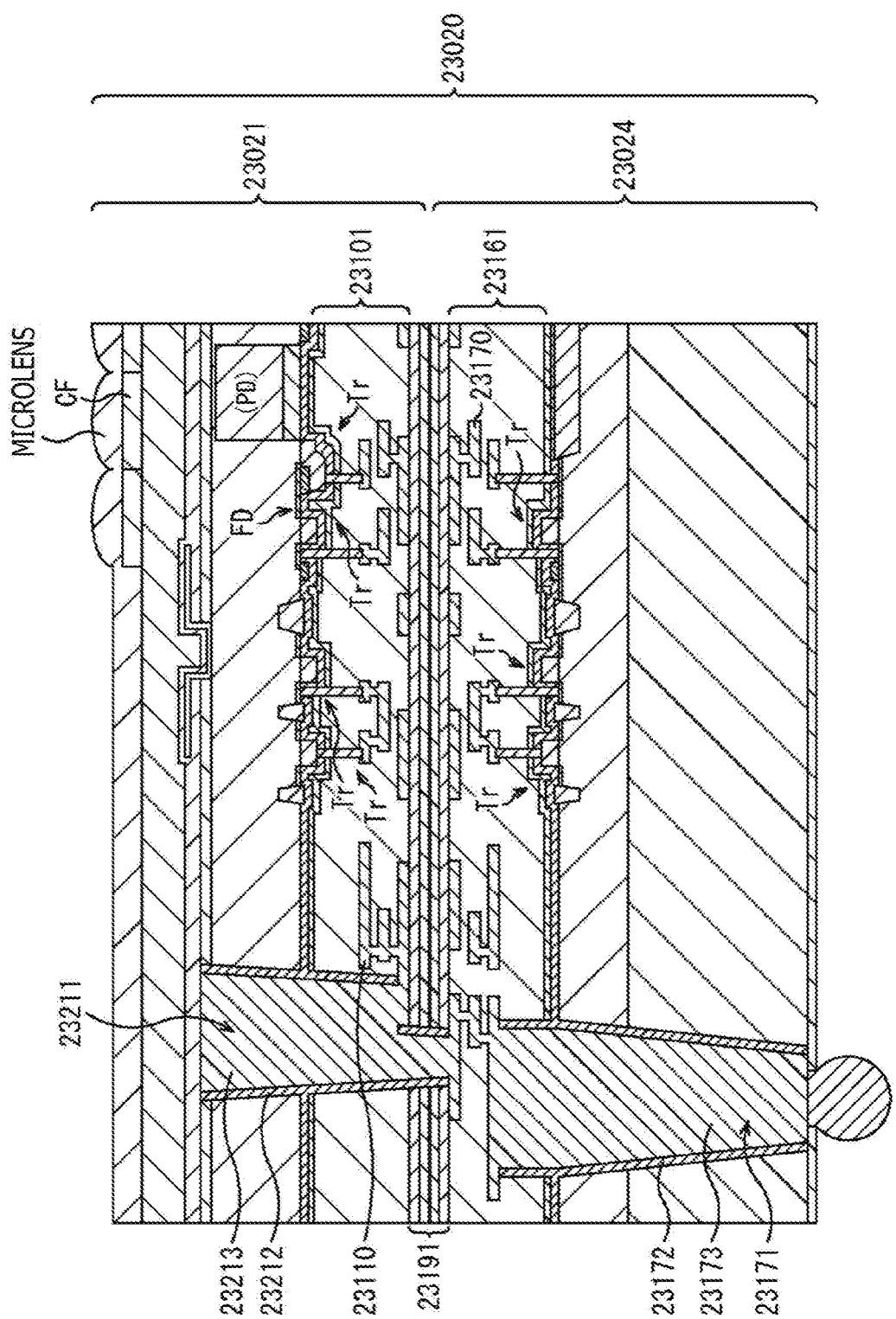
FIG. 15 is a cross-sectional view depicting a second configuration example of the stacked solid-state imaging device.

FIG. 15 is a cross-sectional view depicting a second configuration example of the stacked solid-state imaging device 23020.

According to the second configuration example of the solid-state imaging device 23020, ((the wiring 23110 of) the wiring layer 23101 of) the sensor die 23021 and ((the wiring 23170) of the wiring layer 23161 of) the logic die 23024 are electrically connected to each other by one connection hole 23211 formed in the sensor die 23021.

More specifically, in FIG. 15, the connection hole 23211 is so formed as to extend from the rear surface side of the sensor die 23021, penetrate the sensor die 23021, and reach the wiring 23170 in the uppermost layer of the logic die 23024, and also reach the wiring 23110 in the uppermost layer of the sensor die 23021. An insulation film 23212 is formed on an inner wall surface of the connection hole 23211, and a connection conductor 23213 is embedded in the connection hole 23211. In FIG. 4 described above, the sensor die 23021 and the logic die 23024 are electrically connected to each other via the two connection holes 23111 and 23121. In FIG. 15, however, the sensor die 23021 and the logic die 23024 are electrically connected to each other via the one connection hole 23211.

Figure 16:
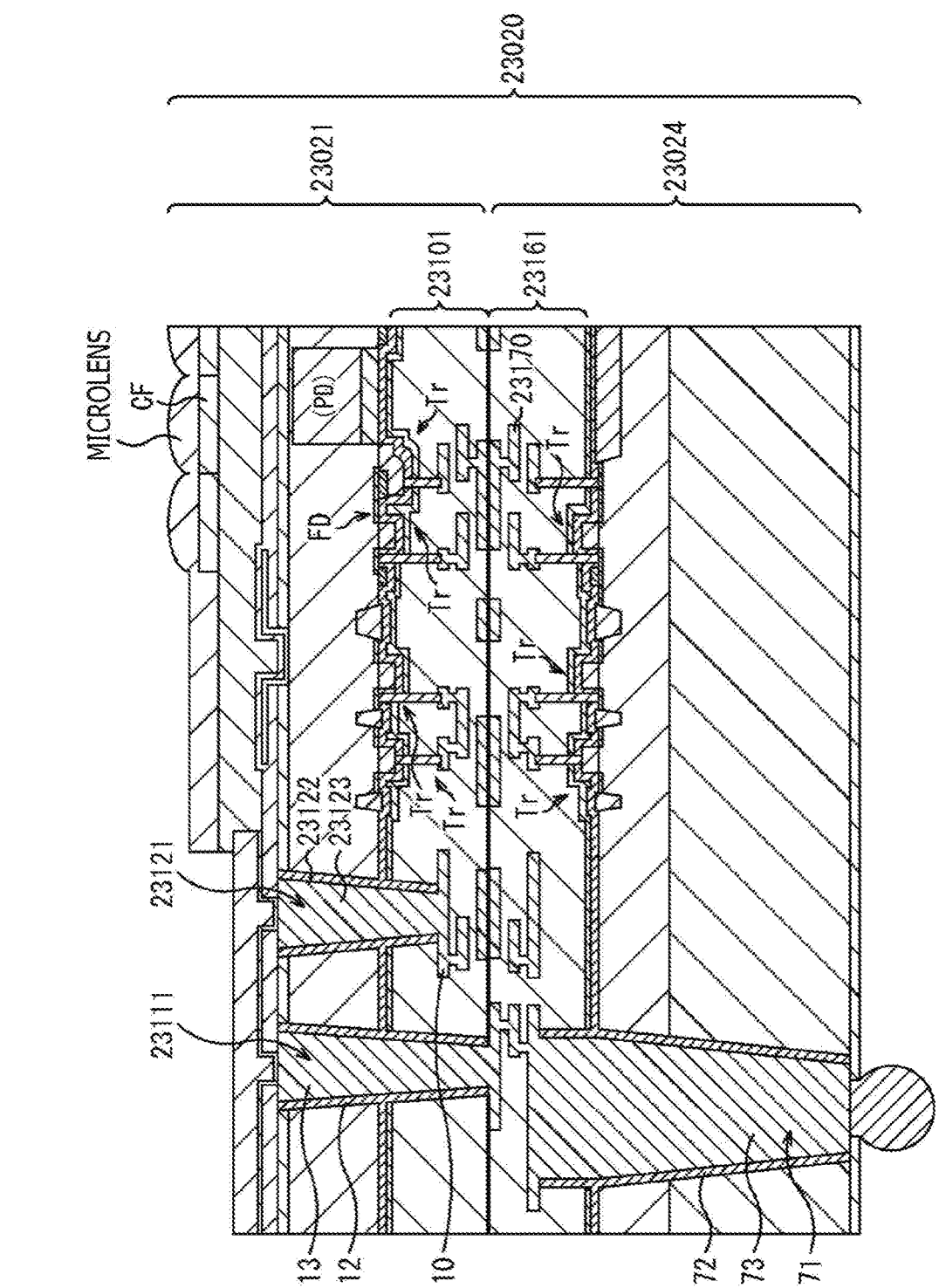
FIG. 16 is a cross-sectional view depicting a third configuration example of the stacked solid-state imaging device.

FIG. 16 is a cross-sectional view depicting a third configuration example of the stacked solid-state imaging device 23020.

The solid-state imaging device 23020 in FIG. 16 does not include the film 23191, such as a protection film, on the affixing surfaces of the sensor die 23021 and the logic die 23024, and therefore is different from the case of FIG. 14 in which the film 23191, such as a protection film, is provided on the affixing surfaces of the sensor die 23021 and the logic die 23024.

For constituting the solid-state imaging device 23020 in FIG. 16, the sensor die 23021 and the logic die 23024 are overlapped with each other with a direct contact between the wiring 23110 and the wiring 23170. Thereafter, the sensor die 23021 and the logic die 23024 are heated with a predetermined load applied, and the wiring 23110 and the wiring 23170 are directly joined.

Figure 17:
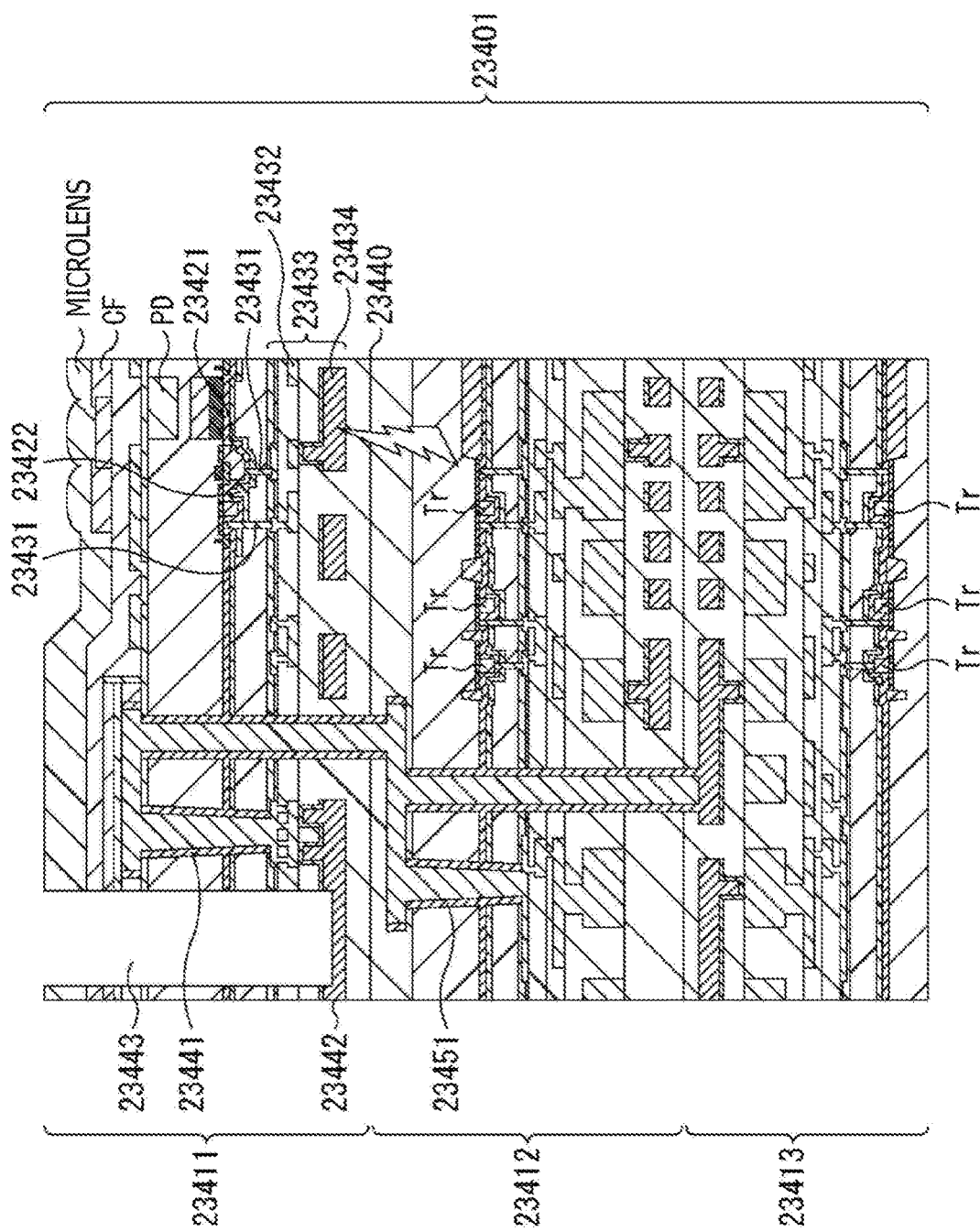
FIG. 17 is a cross-sectional view depicting another configuration example of the stacked solid-state imaging device to which the technology according to the present disclosure is applicable.

FIG. 17 is a cross-sectional view depicting another configuration example of a stacked solid-state imaging device to which the technology according to the present disclosure is applicable.

A solid-state imaging device 23401 in FIG. 17 has a three-layer stacked structure which includes three stacked dies, i.e., a sensor die 23411, a logic die 23412, and a memory die 23413.

For example, the memory die 23413 has a memory circuit which stores data temporarily needed for signal processing performed by the logic die 23412.

In FIG. 17, the logic die 23412 and the memory die 23413 are stacked in this order below the sensor die 23411. However, the logic die 23412 and the memory die 23413 may be stacked in a reverse order, i.e., in the order of the memory die 23413 and the logic die 23412, below the sensor die 23411.

Note that the sensor die 23411 in FIG. 17 includes a PD corresponding to a photoelectric conversion unit for pixels, and a source/drain region for a pixel Tr.

A gate electrode is provided around the PD via a gate insulation film. A pixel Tr 23421 and a pixel Tr 23422 each include the gate electrode and a pair of source and drain regions.

The pixel Tr 23421 adjacent to the PD corresponds to a transfer Tr. One of the pair of source and drain regions constituting the pixel Tr 23421 corresponds to an FD.

In addition, an interlayer insulation film is provided on the sensor die 23411. A connection hole is formed in the interlayer insulation film. A connection conductor 23431 connected to the pixel Tr 23421 and the pixel Tr 23422 is provided in the connection hole.

The sensor die 23411 further includes a wiring layer 23433 which includes wiring 23432 having a plurality of layers and connected to the respective connection conductors 23431.

An aluminum pad 23434 corresponding to an electrode for external connection is further provided in the lowermost layer of the wiring layer 23433 of the sensor die 23411. More specifically, the aluminum pad 23434 of the sensor die 23411 is disposed at a position closer to a bonding surface 23440 with the logic die 23412 than the wiring 23432 is. The aluminum pad 23434 is provided as one end of wiring associated with input and output of signals to and from the outside.

The sensor die 23411 further includes a contact 23441 provided for electric connection with the logic die 23412. The contact 23441 is connected to a contact 23451 of the logic die 23412, and also connected to the aluminum pad 23442 of the sensor die 23411.

The sensor die 23411 further includes a pad hole 23443 which extends from the rear surface side (the upper side) of the sensor die 23411 and reaches the aluminum pad 23442.

The technology according to the present disclosure is applicable to the solid-state imaging device described above.

11. Example of Application to Mobile Body

The technology according to the present disclosure (present technology) is applicable to various products. For example, the technology according to the present disclosure may be practiced in the form of a device mounted on a mobile body of any one of types such as a car, an electric car, a hybrid electric car, a motorcycle, a bicycle, a personal mobility, an airplane, a drone, a vessel, and a robot.

Figure 18:
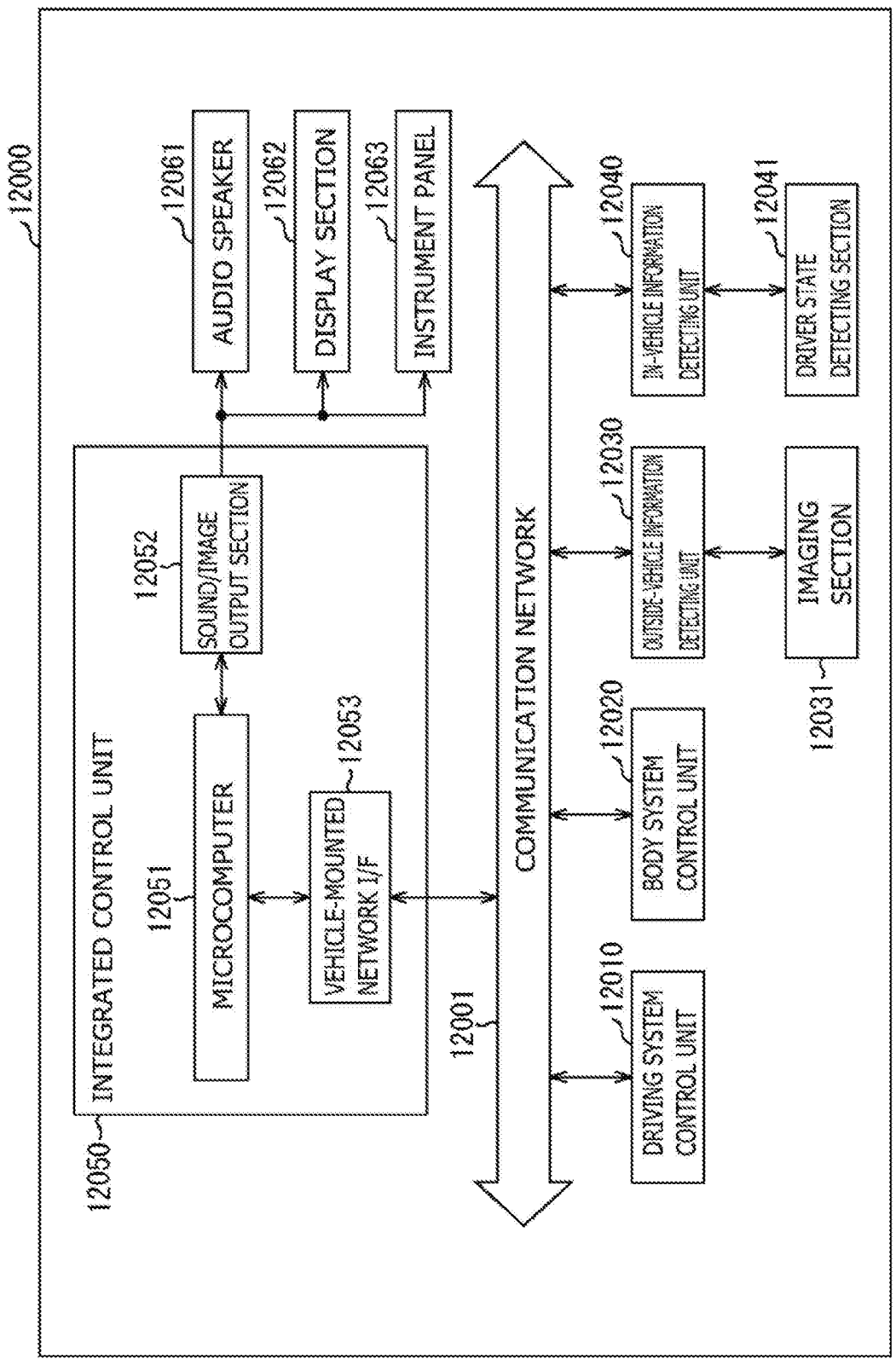
FIG. 18 is a block diagram depicting an example of a schematic configuration of a vehicle control system.

FIG. 18 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 18, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 18, an audio speaker 12061, a display section 12062, and an instrument panel 12063 are illustrated as the output device. The display section 12062 may, for example, include at least one of an on-board display and a head-up display.

Figure 19:
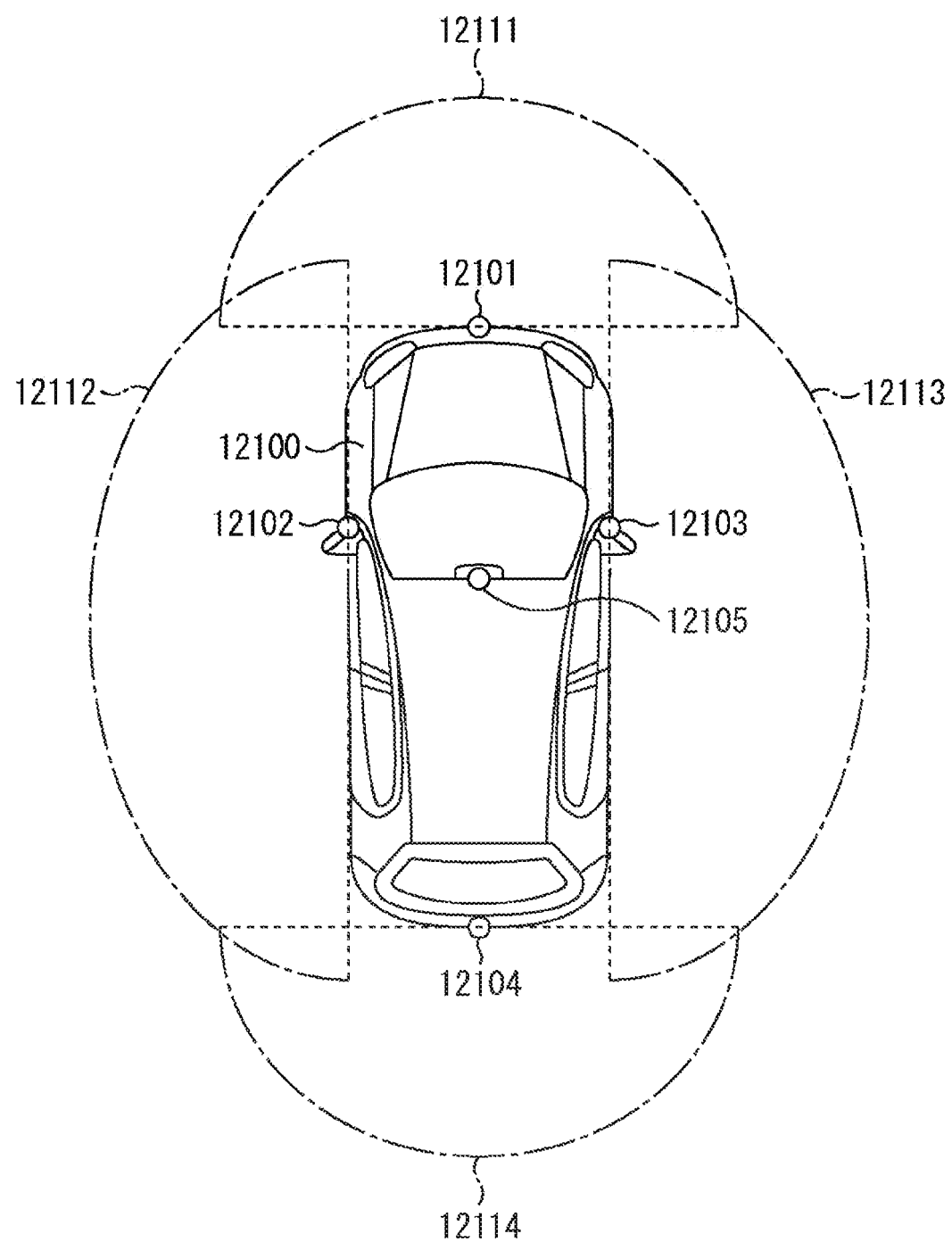
FIG. 19 is a diagram of assistance in explaining an example of installation positions of an outside-vehicle information detecting section and an imaging section.

FIG. 19 is a diagram depicting an example of the installation position of the imaging section 12031.

In FIG. 19, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 19 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description of the example of the vehicle control system to which the technology according to the present disclosure is applicable has been now completed. The technology according to the present disclosure is applicable to the imaging section 12101 in the configuration described above. More specifically, the solid-state imaging device 10 in FIG. 3 is applicable to the imaging section 12101. For example, reduction of power consumption of pixels and an increase in the number of pixels are achievable by applying the technology according to the present disclosure to the imaging section 12101. Accordingly, a higher quality image can be captured, wherefore an obstacle such as a pedestrian can be more accurately recognized.

12. Example of Application to In-Vivo Information Acquisition System

The technology according to the present disclosure (present technology) is applicable to various products. For example, the technology according to the present disclosure may be applied to an endoscopic surgery system.

Figure 20:
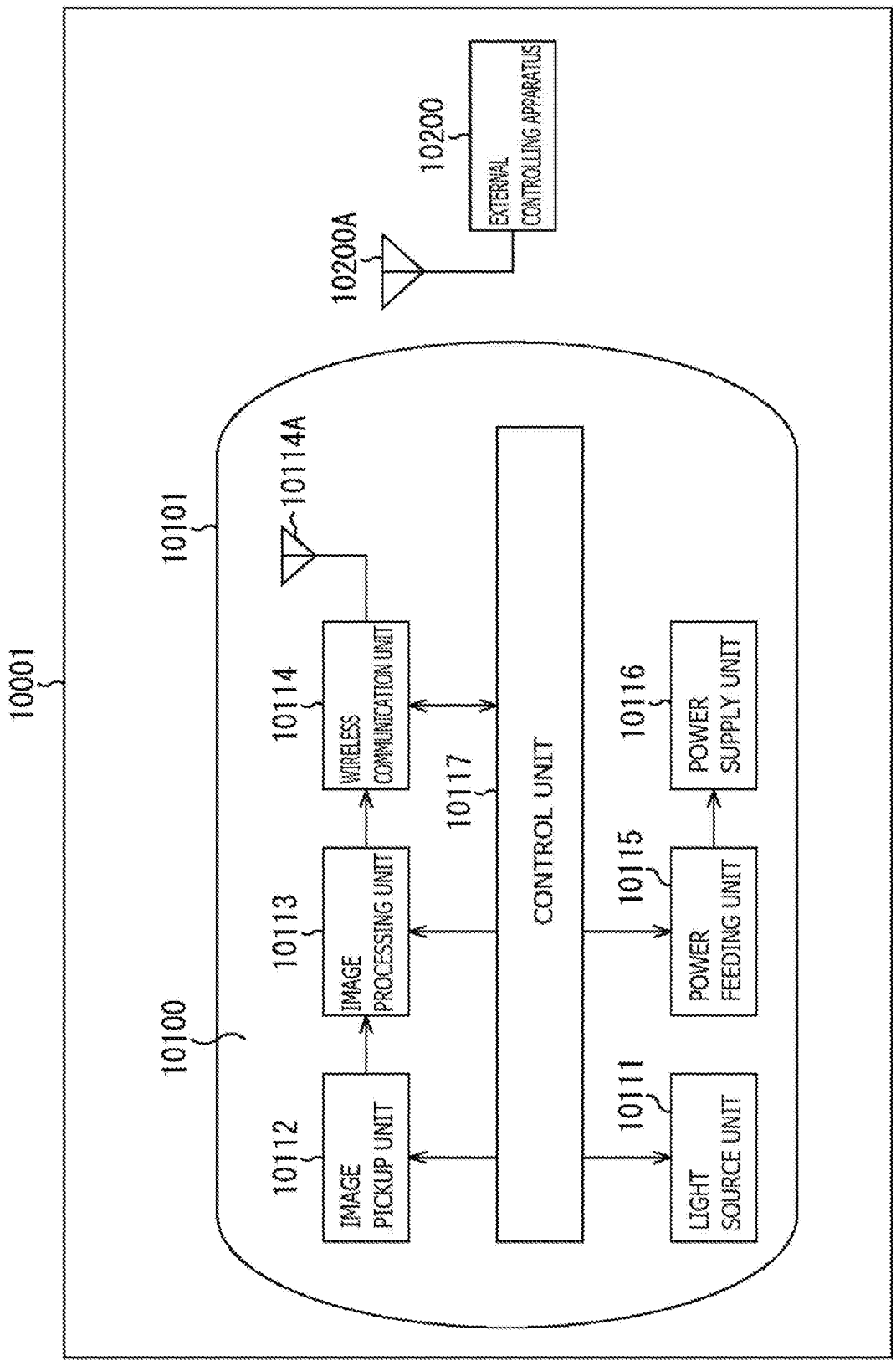
FIG. 20 is a block diagram depicting an example of a schematic configuration of an in-vivo information acquisition system.

FIG. 20 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 20, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

Description of the example of the in-vivo information acquisition system to which the technology according to the present disclosure is applicable has been now completed. The technology according to the present disclosure is applicable to the image pickup unit 10112 in the configuration described above. More specifically, the solid-state imaging device 10 in FIG. 3 is applicable to the image pickup unit 10112. For example, reduction of power consumption of pixels and an increase in the number of pixels are achievable by applying the technology according to the present disclosure to the image pickup unit 10112. Accordingly, a higher quality image can be captured, wherefore more accurate in-vivo information associated with a patient can be acquired.

Note that the technology according to the present disclosure (present technology) is not limited to the embodiments described above, but may be modified in various manners without departing from the scope of the subject matters of the technology according to present disclosure.

In addition, the technology according to the present disclosure may have following configurations.

(1)

A solid-state imaging device including:

a pixel array unit that includes pixels arranged in a matrix, from each of the pixels an output signal indicating a logarithmic characteristic being acquired, each of the pixels including a photoelectric conversion unit, a reset transistor that resets the photoelectric conversion unit in accordance with a reset signal, a first amplification transistor that amplifies a signal received from the photoelectric conversion unit, a selection transistor that selects a signal received from the first amplification transistor in accordance with a selection signal, a second amplification transistor that amplifies a signal received from the selection transistor, and applies the amplified signal to a vertical signal line, and a bias transistor that is connected to the selection transistor and the second amplification transistor, and functions as a current source, in which the first amplification transistor and the second amplification transistor are each connected to a power source voltage.

(2)

The solid-state imaging device according to (1) described above, in which a gate of the first amplification transistor is connected to the photoelectric conversion unit, a source of the first amplification transistor is connected to a drain of the selection transistor, a drain of the first amplification transistor is connected to the power source voltage, a gate of the second amplification transistor is connected to a source of the selection transistor, a source of the second amplification transistor is connected to the vertical signal line, and a drain of the second amplification transistor is connected to the power source voltage.

(3)

The solid-state imaging device according to (2) described above, in which a source of the bias transistor is grounded, and a drain of the bias transistor is connected to the source of the selection transistor and the gate of the second amplification transistor.

(4)

The solid-state imaging device according to (3) described above, in which the reset transistor is so driven as to come into an on-state at a readout time of a reset level during a shutter driving period before an exposure period, and a readout period after the exposure period, and the selection transistor is so driven as to come into an on-state during the readout period.

(5)

The solid-state imaging device according to (3) described above, in which the reset transistor is so driven as to come into an on-state at a readout time of a reset level during a shutter driving period before an exposure period, and a readout period after the exposure period, the selection transistor is so driven as to come into an on-state during the readout period, and the bias transistor is so driven as to come into an off-state in periods except for the readout period.

(6)

The solid-state imaging device according to any one of (3) to (6) described above, in which polarities of the photoelectric conversion unit, the first amplification transistor, the selection transistor, the second amplification transistor, and the bias transistor are inversed.

(7)

The solid-state imaging device according to any one of (3) to (5) described above, in which the bias transistor and the second amplification transistor are shared by a plurality of the pixels.

(8)

The solid-state imaging device according to (7) described above, in which polarities of the photoelectric conversion unit, the first amplification transistor, the selection transistor, the second amplification transistor, and the bias transistor are inversed.

(9)

The solid-state imaging device according to any one of (1) to (8) described above, in which the solid-state imaging device includes a logarithmic sensor in a solar cell mode.

(10)

An electronic apparatus including:

a solid-state imaging device that includes a pixel array unit including pixels arranged in a matrix, from each of the pixels an output signal indicating a logarithmic characteristic being acquired, each of the pixels including a photoelectric conversion unit, a reset transistor that resets the photoelectric conversion unit in accordance with a reset signal, a first amplification transistor that amplifies a signal received from the photoelectric conversion unit, a selection transistor that selects a signal received from the first amplification transistor in accordance with a selection signal, a second amplification transistor that amplifies a signal received from the selection transistor, and applies the amplified signal to a vertical signal line, and a bias transistor that is connected to the selection transistor and the second amplification transistor, and functions as a current source, in which the first amplification transistor and the second amplification transistor are each connected to a power source voltage.

(11)

A driving method of a solid-state imaging device that includes a pixel array unit, the pixel array unit including pixels arranged in a matrix, from each of the pixels an output signal indicating a logarithmic characteristic being acquired, each of the pixels including a photoelectric conversion unit, a reset transistor that resets the photoelectric conversion unit in accordance with a reset signal, a first amplification transistor that amplifies a signal received from the photoelectric conversion unit, a selection transistor that selects a signal received from the first amplification transistor in accordance with a selection signal, a second amplification transistor that amplifies a signal received from the selection transistor, and applies the amplified signal to a vertical signal line, and a bias transistor that is connected to the selection transistor and the second amplification transistor, and functions as a current source, in which the first amplification transistor and the second amplification transistor are each connected to a power source voltage, the driving method including:

driving such that the reset transistor comes into an on-state during a shutter driving period before an exposure period;

driving such that the selection transistor comes into an on-state during a readout period after the exposure period; and driving such that the reset transistor comes into the on-state at a readout time of a reset level during the readout period.

(12)

A driving method of a solid-state imaging device that includes a pixel array unit, the pixel array unit including pixels arranged in a matrix, from each of the pixels an output signal indicating a logarithmic characteristic being acquired, each of the pixels including a photoelectric conversion unit, a reset transistor that resets the photoelectric conversion unit in accordance with a reset signal, a first amplification transistor that amplifies a signal received from the photoelectric conversion unit, a selection transistor that selects a signal received from the first amplification transistor in accordance with a selection signal, a second amplification transistor that amplifies a signal received from the selection transistor, and applies the amplified signal to a vertical signal line, and a bias transistor that is connected to the selection transistor and the second amplification transistor, and functions as a current source, in which the first amplification transistor and the second amplification transistor are each connected to a power source voltage, the driving method including:

driving such that the reset transistor comes into an on-state during a shutter driving period before an exposure period;

driving such that the selection transistor comes into an on-state during a readout period after the exposure period;

driving such that the reset transistor comes into the on-state at a readout time of a reset level during the readout period; and driving such that the bias transistor comes into an off-state during periods except for the readout period.

REFERENCE SIGNS LIST

10 Solid-state imaging device
11 Pixel array unit
100, 200 Pixel
111, 211 Photodiode
112, 212 Reset transistor
113, 213 Amplification transistor
114, 214 Bias transistor
115, 215 Amplification transistor
116, 216 Selection transistor
121, 221 Vertical signal line
300 Pixel
311 Photodiode
312 Reset transistor
313 Amplification transistor
314 Bias transistor
315 Amplification transistor
316 Selection transistor
321 Vertical signal line
400-1, 400-2, 500-1, 500-2 Pixel
411-1, 411-2, 511-1, 511-2 Photodiode
412-1, 412-2, 512-1, 512-2 Reset transistor
413-1, 413-2, 513-1, 513-2 Amplification transistor
414, 514 Bias transistor
415, 515 Amplification transistor
416-1, 416-2, 516-1, 516-2 Selection transistor
421, 521 Vertical signal line
1000 Electronic apparatus
1001 Solid-state imaging element

The invention claimed is:

1. A solid-state imaging device, comprising:
a pixel array unit that includes pixels arranged in a matrix, wherein, from each of the pixels, an output signal indicating a logarithmic characteristic is acquired, and each of the pixels includes;
a photoelectric conversion unit;
a reset transistor that resets the photoelectric conversion unit in accordance with a reset signal;
a first amplification transistor that amplifies a signal received from the photoelectric conversion unit;
a selection transistor that selects a signal received from the first amplification transistor in accordance with a selection signal;
a second amplification transistor that amplifies a signal received from the selection transistor, and applies the amplified signal to a vertical signal line; and
a bias transistor that is connected to the selection transistor and the second amplification transistor, and functions as a current source, wherein the first amplification transistor and the second amplification transistor are each connected to a power source voltage.

2. The solid-state imaging device according to claim 1, wherein
a gate of the first amplification transistor is connected to the photoelectric conversion unit,
a source of the first amplification transistor is connected to a drain of the selection transistor,
a drain of the first amplification transistor is connected to the power source voltage,
a gate of the second amplification transistor is connected to a source of the selection transistor,
a source of the second amplification transistor is connected to the vertical signal line, and
a drain of the second amplification transistor is connected to the power source voltage.

3. The solid-state imaging device according to claim 2, wherein
a source of the bias transistor is grounded, and
a drain of the bias transistor is connected to the source of the selection transistor and the gate of the second amplification transistor.

4. The solid-state imaging device according to claim 3, wherein
the reset transistor is so driven as to come into an on-state at a readout time of a reset level during a shutter driving period before an exposure period, and a readout period after the exposure period, and
the selection transistor is so driven as to come into an on-state during the readout period.

5. The solid-state imaging device according to claim 3, wherein
the reset transistor is so driven as to come into an on-state at a readout time of a reset level during a shutter driving period before an exposure period, and a readout period after the exposure period,
the selection transistor is so driven as to come into an on-state during the readout period, and
the bias transistor is so driven as to come into an off-state in periods except for the readout period.

6. The solid-state imaging device according to claim 3, wherein polarities of the photoelectric conversion unit, the first amplification transistor, the selection transistor, the second amplification transistor, and the bias transistor are inversed.

7. The solid-state imaging device according to claim 3, wherein the bias transistor and the second amplification transistor are shared by a plurality of the pixels.

8. The solid-state imaging device according to claim 7, wherein polarities of the photoelectric conversion unit, the first amplification transistor, the selection transistor, the second amplification transistor, and the bias transistor are inversed.

9. The solid-state imaging device according to claim 1, wherein the solid-state imaging device includes a logarithmic sensor in a solar cell mode.

10. An electronic apparatus, comprising:
a solid-state imaging device that includes a pixel array unit including pixels arranged in a matrix, wherein, from each of the pixels, an output signal indicating a logarithmic characteristic is acquired, and each of the pixels includes:
a photoelectric conversion unit;
a reset transistor that resets the photoelectric conversion unit in accordance with a reset signal;
a first amplification transistor that amplifies a signal received from the photoelectric conversion unit;
a selection transistor that selects a signal received from the first amplification transistor in accordance with a selection signal;
a second amplification transistor that amplifies a signal received from the selection transistor, and applies the amplified signal to a vertical signal line; and
a bias transistor that is connected to the selection transistor and the second amplification transistor, and functions as a current source, wherein the first amplification transistor and the second amplification transistor are each connected to a power source voltage.

11. A driving method of a solid-state imaging device that includes a pixel array unit, the pixel array unit including pixels arranged in a matrix, from each of the pixels an output signal indicating a logarithmic characteristic being acquired, each of the pixels including
a photoelectric conversion unit,
a reset transistor that resets the photoelectric conversion unit in accordance with a reset signal,
a first amplification transistor that amplifies a signal received from the photoelectric conversion unit,
a selection transistor that selects a signal received from the first amplification transistor in accordance with a selection signal,
a second amplification transistor that amplifies a signal received from the selection transistor, and applies the amplified signal to a vertical signal line, and
a bias transistor that is connected to the selection transistor and the second amplification transistor, and functions as a current source,
wherein the first amplification transistor and the second amplification transistor are each connected to a power source voltage,
the driving method comprising:
driving such that the reset transistor comes into an on-state during a shutter driving period before an exposure period;
driving such that the selection transistor comes into an on-state during a readout period after the exposure period; and
driving such that the reset transistor comes into the on-state at a readout time of a reset level during the readout period.

12. A driving method of a solid-state imaging device that includes a pixel array unit, the pixel array unit including pixels arranged in a matrix, from each of the pixels an output signal indicating a logarithmic characteristic being acquired, each of the pixels including
a photoelectric conversion unit,
a reset transistor that resets the photoelectric conversion unit in accordance with a reset signal,
a first amplification transistor that amplifies a signal received from the photoelectric conversion unit,
a selection transistor that selects a signal received from the first amplification transistor in accordance with a selection signal,
a second amplification transistor that amplifies a signal received from the selection transistor, and applies the amplified signal to a vertical signal line, and
a bias transistor that is connected to the selection transistor and the second amplification transistor, and functions as a current source,
wherein the first amplification transistor and the second amplification transistor are each connected to a power source voltage,
the driving method comprising:
driving such that the reset transistor comes into an on-state during a shutter driving period before an exposure period;
driving such that the selection transistor comes into an on-state during a readout period after the exposure period;
driving such that the reset transistor comes into the on-state at a readout time of a reset level during the readout period; and
driving such that the bias transistor comes into an off-state during periods except for the readout period.

* * * * *